(12) United States Patent
Kim

(10) Patent No.: US 12,412,607 B2
(45) Date of Patent: Sep. 9, 2025

(54) SEMICONDUCTOR DEVICES RELATED TO DATA INPUT AND OUTPUT OPERATIONS

(71) Applicant: SK hynix Inc., Icheon-si (KR)

(72) Inventor: Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 148 days.

(21) Appl. No.: 18/470,271

(22) Filed: Sep. 19, 2023

(65) Prior Publication Data

US 2024/0395296 A1    Nov. 28, 2024

(30) Foreign Application Priority Data

May 22, 2023  (KR) .......................... 10-2023-0065943

(51) Int. Cl.
*G11C 7/22* (2006.01)
*G11C 7/10* (2006.01)
*G11C 7/20* (2006.01)

(52) U.S. Cl.
CPC .............. *G11C 7/222* (2013.01); *G11C 7/106* (2013.01); *G11C 7/1066* (2013.01); *G11C 7/1087* (2013.01); *G11C 7/1093* (2013.01); *G11C 7/20* (2013.01)

(58) Field of Classification Search
CPC ........................................................ G11C 8/18
See application file for complete search history.

(56) References Cited

U.S. PATENT DOCUMENTS

2023/0290394 A1* 9/2023 Chae .................... G11C 7/1039

FOREIGN PATENT DOCUMENTS

KR        1020090066040 A     6/2009

* cited by examiner

*Primary Examiner* — Hoai V Ho
(74) *Attorney, Agent, or Firm* — WILLIAM PARK & ASSOCIATES LTD.

(57) ABSTRACT

A semiconductor device includes a strobing signal generating circuit configured to sequentially generate write input signals, based on a write strobing signal and to sequentially generate write output signals, based on a delayed write strobing signal when a write operation is performed. The semiconductor device incudes an input/output control circuit configured to receive and latch write data input from a data input/output circuit, based on the write input signals, and to store the latched write data in a cell area as write core data, based on the write output signals.

33 Claims, 22 Drawing Sheets

SEMICONDUCTOR DEVICES RELATED TO DATA INPUT AND OUTPUT OPERATIONS

CROSS-REFERENCE TO RELATED APPLICATIONS

The present application claims priority under 35 U.S.C. 119(a) to Korean Application No. 10-2023-0065943, filed on May 22, 2023, which is incorporated herein by reference in its entirety.

BACKGROUND

1. Technical Field

Embodiments of the present disclosure generally relates to semiconductor devices, and more particularly, to semiconductor devices related to data input and output operations.

2. Related Art

Recently, as the data transmission rate of a semiconductor device increases rapidly, the data transmission rate acts as a major factor in designing semiconductor devices. In the case of the low power DDR5 (LPDDR5), data transmission rate of 8533 Mbps is supported, and in the future, LPDDR6 will support data transmission rate of 12 Gbps.

As the data transmission rate increases, the interval at which read operations or write operations are performed is also greatly reduced. In particular, in the case of global input/output lines, line loading is great, a skew difference occurs severely according to a length difference between global input/output lines, and it is difficult to secure a margin for transmitted data due to process changes.

SUMMARY

An embodiment of the present disclosure may provide a semiconductor device including a strobing signal generating circuit configured to sequentially generate write input signals, based on a write strobing signal and to sequentially generate write output signals, based on a delayed write strobing signal when a write operation is performed, and an input/output control circuit configured to receive and latch write data input from a data input/output circuit, based on the write input signals, and to store the latched write data in a cell area as write core data, based on the write output signals.

In addition, an embodiment of the present disclosure may provide a semiconductor device including a strobing signal generating circuit configured to sequentially generate read input signals, based on a read strobing signal and to sequentially generate read output signals, based on a delayed read strobing signal when a read operation is performed, and an input/output control circuit configured to receive and latch read core data output from a cell area, based on the read input signals, and to output the latched read core data to a data input/output circuit as read data, based on the read output signals.

In addition, an embodiment of the present disclosure may provide a semiconductor device including a strobing signal generating circuit configured to sequentially generate write input signals, based on a write strobing signal and sequentially generate write output signals, based on a delayed write strobing signal when a write operation is performed, and to sequentially generate read input signals, based on a read strobing signal and sequentially generate read output signals, based on a delayed read strobing signal when a read operation is performed, and an input/output control circuit configured to receive and latch write data input from a data input/output circuit, based on the write input signals, to store the latched write data in a cell area as write core data, based on the write output signals, to receive and latch read core data output from the cell area, based on the read input signals, and to output the latched read core data to the data input/output circuit as read data, based on the read output signals.

DETAILED DESCRIPTION

In the following description of embodiments, when a parameter is referred to as being "predetermined" or "preset" it may be intended to mean that a value of the parameter is determined in advance when the parameter is used in a process or an algorithm. The value of the parameter may be set when the process or the algorithm starts or may be set during a section that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
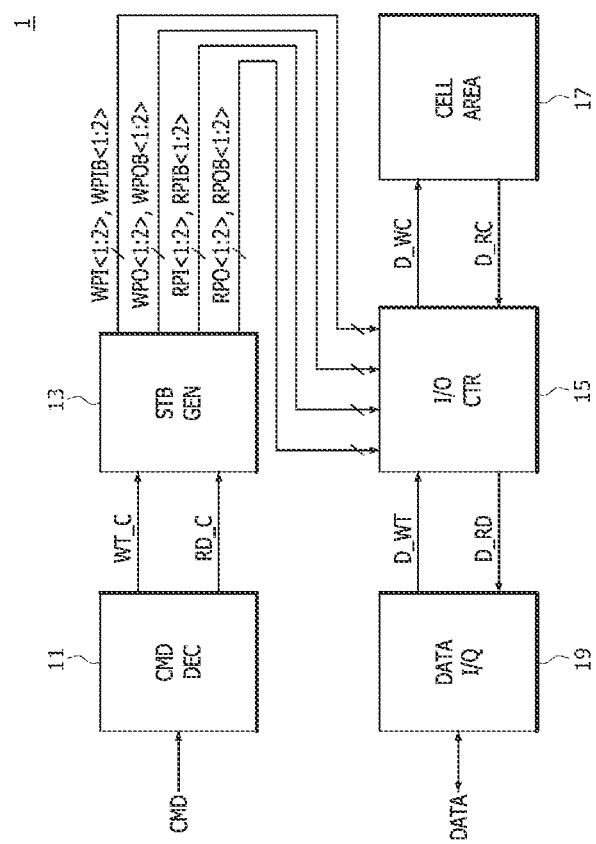
FIG. 1 is a block diagram illustrating a configuration of a semiconductor device according to an embodiment of the present disclosure.

FIG. 1 is a block diagram illustrating a configuration of a semiconductor device 1 according to an embodiment of the present disclosure. As shown in FIG. 1, the semiconductor device 1 may include a command decoder (CMD DEC) 11, a strobing signal generating circuit (STB GEN) 13, an input/output control circuit (I/O CTR) 15, a cell area 17, and a data input/output circuit (DATA I/O) 19.

The command decoder 11 may generate a write command WT_C or a read command RD_C, based on a command CMD. The command decoder 11 may receive the command CMD from a controller (14 of FIG. 20), and decode the command CMD to generate the write command WT_C or the read command RD_C. The command decoder 11 may generate one of the write command WT_C and the read command RD_C depending on a logic bit set of bits included in the command CMD. The write command WT_C may be generated for a write operation of storing write data D_WT input from the data input/output circuit 19 in the cell area 17 as write core data D_WC. The read command RD_C may be generated for a read operation of outputting read core data D_RC output from the write core data D_WC as read data D_RD through the data input/output circuit 19. The command decoder 11 may be connected to the strobing signal generating circuit 13 to supply the write command WT_C and the read command RD_C to the strobing signal generating circuit 13.

The strobing signal generating circuit 13 may generate first and second write input signals WPI<1:2>, first and second inverted write input signals WPIB<1:2>, first and second write output signals WPO<1:2>, first and second inverted write output signals WPOB<1:2>, first and second read input signals RPI<1:2>, first and second inverted read input signals RPIB<1:2>, first and second read output signals RPO<1:2>, and first and second inverted read output signals RPOB<1:2>, based on the write command WT_C and the read command RD_C. When a write operation is performed and the write command WT_C is generated, the strobing signal generating circuit 13 may generate the first write input signal WPI<1> and the first inverted write input signal WPIB<1>, and then generate the second write input signal WPI<2> and the second inverted write input signal WPIB<2> in order to receive and latch the write data D_WT input from the data input/output circuit 19. In order to store the write data D_WT latched in the write operation as the write core data D_WC, the strobing signal generating circuit 13 may generate the first write output signal WPO<1> and the first inverted write output signal WPOB<1>, and then generate the second write output signal WPO<2> and the second inverted write output signal WPOB<2>. When a read operation is performed and the read command RD_C is generated, the strobing signal generating circuit 13 may generate the first read input signal RPI<1> and the first inverted read input signal RPIB<1>, and then generate the second read input signal RPI<2> and the second inverted read input signal RPIB<2> in order to receive and latch the read core data D_RC output from the cell area 17. In order to output the read core data D_RC latched in the read operation as the read data D_RD through the data input/ output circuit 19, the strobing signal generating circuit 13 may generate the first read output signal RPO<1> and the first inverted read output signal RPOB<1>, and then generate the second read output signal RPO<2> and the second inverted read output signal ROPB<2>. The strobing signal generating circuit 13 may be connected to the input/output control circuit 15 to supply the first and second write input signals WPI<1:2>, the first and second inverted write input signals WPIB<1:2>, the first and second write output signals WPO<1:2>, the first and second inverted write output signals WPOB<1:2>, the first and second read input signals RPI<1:2>, the first and second inverted read input signals RPIB<1:2>, the first and second read output signals RPO<1:

2>, and the first and second inverted read output signals RPOB<1:2> to the input/output control circuit 15.

The input/output control circuit 15 may control data input and output operations, based on the first and second write input signals WPI<1:2>, the first and second inverted write input signals WPIB<1:2>, the first and second write output signals WPO<1:2>, the first and second inverted write output signals WPOB<1:2>, the first and second read input signals RPI<1:2>, the first and second inverted read input signals RPIB<1:2>, the first and second read output signals RPO<1:2>, and the first and second inverted read output signals RPOB<1:2>. The input/output control circuit 15 may receive and latch the write data D_WT input from the data input/output circuit 19 in the write operation, based on the first and second write input signals WPI<1:2> and the first and second inverted write input signals WPIB<1:2>. The input/output control circuit 15 may store the write data D_WT latched in the write operation in the cell area 17 as the write core data D_WC, based on the first and second write output signals WPO<1:2> and the first and second inverted write output signals WPOB<1:2>. The input/output control circuit 15 may receive and latch the read core data D_RD output from the cell area 17 in the read operation, based on the first and second read input signals RPI<1:2> and the first and second inverted read input signals RPIB<1:2>. The input/output control circuit 15 may output the read core data D_RC latched in the read operation as the read data D_RD through the data input/output circuit 19, based on the first and second read output signals RPO<1:2> and the first and second inverted read output signals RPOB<1:2>. The input/output control circuit 15 may be connected to the cell area 17 and the data input/output circuit 19 to receive and latch the write data D_WT from the data input/output circuit 19 in the write operation, to store the latched write data D_WT in the cell area 17 as the write core data D_WC, to receive and latch the read core data D_RC output from the cell area 17 in the read operation, and to output the latched read core data D_RC as the read data D_RD through the data input/output circuit 19.

The cell area 17 may receive and store the write core data D_WC supplied from the input/output control circuit 15 in the write operation, and supply the read core data D_RC to the input/output control circuit 15 in the read operation. The cell area 17 may include a plurality of memory cells (not shown), control circuits (not shown) required to receive and store the write core data D_WC, and control circuits (not shown) required to output the read core data D_RC.

The data input/output circuit 19 may supply the write data D_WT to the input/output control circuit 15 during the write operation, and output the read data D_RD supplied from the input/output control circuit 15 during the read operation. The data input/output circuit 19 may receive the write data D_WT or output the read data D_RD through a pad (not shown).

In this embodiment, the semiconductor device 1 is implemented to generate the first and second write input signals WPI<1:2>, the first and second inverted write input signals WPIB<1:2>, the first and second write output signals WPO<1:2>, and the first and second inverted write output signals WPOB<1:2> each composed of 2 bits during the write operation, but this is only an embodiment, the present disclosure is not limited thereto. In addition, in this embodiment, the semiconductor device 1 is implemented to generate the first and second read input signals RPI<1:2>, the first and second inverted read input signals RPIB<1:2>, the first and second read output signals RPO<1:2>, and the first and second inverted read output signals RPOB<1:2> each composed of 2 bits during the read operation, but this is only an embodiment, the present disclosure is not limited thereto.

Figure 2:
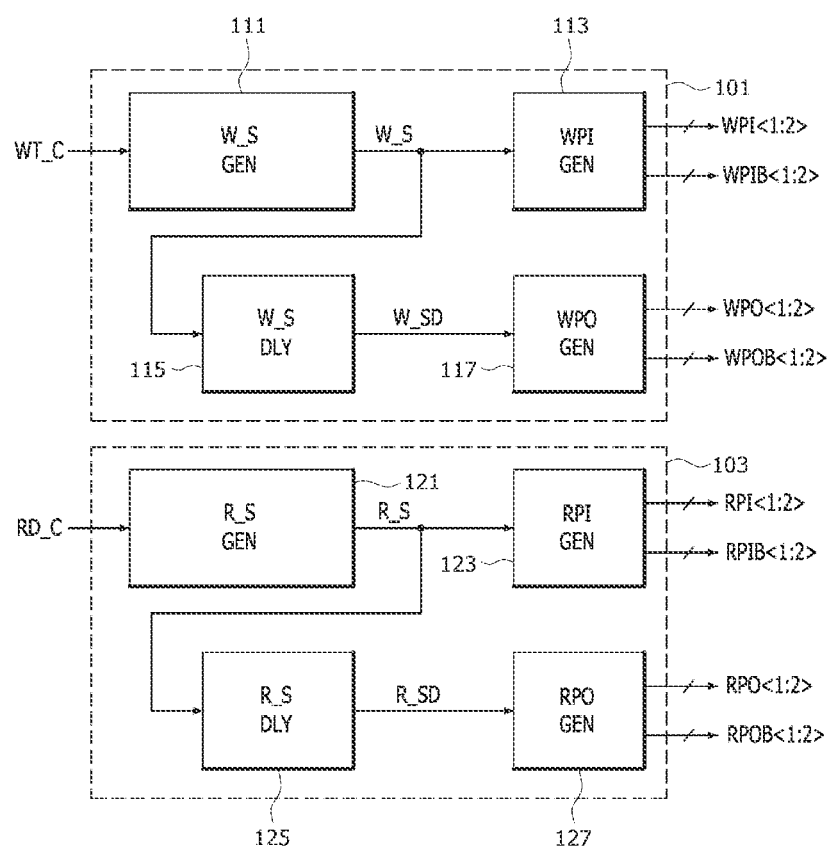
FIG. 2 is a block diagram illustrating a configuration according to an example of a strobing signal generating circuit included in the semiconductor device shown in FIG. 1.

FIG. 2 is a block diagram illustrating a configuration of a strobing signal generating circuit 13A according to an example of the strobing signal generating circuit 13 included in the semiconductor device 1 shown in FIG. 1. As shown in FIG. 2, the strobing signal generating circuit 13A may include a write strobing signal generating circuit 101 and a read strobing signal generating circuit 103.

When the write operation is performed and the write command WT_C is generated, the write strobing signal generating circuit 101 may generate the first write input signal WPI<1> and the first inverted write input signal WPIB<1>, and then generate the second write input signal WPI<2> and the second inverted write input signal WPIB<2> in order to receive and latch the write data D_WT input from the data input/output circuit 19. In order to store the write data D_WT latched in the write operation in the cell area 17 as the write core data D_WC, the write strobing signal generating circuit 101 may generate the first write output signal WPO<1> and the first inverted write output signal WPOB<1>, and then generate the second write output signal WPO<2> and the second inverted write output signal WPOB<2>. The write strobing signal generating circuit 101 may include a write strobing signal generating circuit (W_S GEN) 111, a write input signal generating circuit (WPI GEN) 113, a write strobing signal delay circuit (W_S DLY) 115, and a write output signal generating circuit (WPO GEN) 117.

The write strobing signal generating circuit 111 may generate a write strobing signal W_S when the write operation is performed and the write command WT_C is generated. The time point at which the write strobing signal W_S is generated in the write strobing signal generating circuit 111 may be set in various ways according to embodiments. The write strobing signal generating circuit 111 may be connected to the write input signal generating circuit 113 and the write strobing signal delay circuit 115 to supply the write strobing signal W_S to the write input signal generating circuit 113 and the write strobing signal delay circuit 115.

The write input signal generating circuit 113 may generate the first write input signal WPI<1> and the first inverted write input signal WPIB<1>, and then generate the second write input signal WPI<2> and the second inverted write input signal WPIB<2> whenever the write strobing signal W_S is generated. As an example, the write input signal generating circuit 113 may generate a first pulse of the first write input signal WPI<1> and a first pulse of the first inverted write input signal WPIB<1> when a first pulse of the write strobing signal W_S is generated, and generate a second pule of the second write input signal WPI<2> and a second pulse of the second inverted write input signal WPIB<2> when a second pulse of the write strobing signal W_S is generated.

The write strobing signal delay circuit 115 may delay the write strobing signal W_S by a preset strobing delay section to generate a delayed write strobing signal W_SD. The write strobing delay section may be set in various ways according to embodiments.

The write output signal generating circuit 117 may generate the first write output signal WPO<1> and the first inverted write output signal WPOB<1>, and then generate the second write output signal WPO<2> and the second inverted write output signal WPOB<2> whenever the delayed write strobing signal W_SD is generated. As an example, the write output signal generating circuit 117 may generate a first pulse of the first write output signal WPO<1> and a first pulse of the first inverted write output signal WPOB<1> when a first pulse of the delayed write strobing signal W_SD is generated, and generate a second pulse of the second output signal WPO<2> and a second pulse of the second inverted write output signal WPOB<2> when a second pulse of the delayed write strobing signal W_SD is generated.

The read strobing signal generating circuit 103 may generate the first read input signal RPI<1> and the first inverted read input signal RPIB<1>, and then generate the second read input signal RPI<2> and the second inverted read input signal RPIB<2> in order to receive and latch the read core data D_RC output from the cell area 17 when a read operation is performed and the read command RD_C is generated. The read strobing signal generating circuit 103 may generate the first read output signal RPO<1> and the first inverted read output signal RPOB<1>, and then generate the second read output signal RPO<2> and the second inverted read output signal RPOB<2> in order to output the read core data D_RC latched in the read operation as the read data D_RD through the data input/output circuit 19. The read strobing signal generating circuit 103 may include a read strobing signal generating circuit (R_S GEN) 121, a read input signal generating circuit (RPI GEN) 123, a read strobing signal delay circuit (R_S DLY) 125, and a read output signal generating circuit (RPO GEN) 127.

The read strobing signal generating circuit 121 may generate a read strobing signal R_S when a read operation is performed and the read command RD_C is generated. The time point at which the read strobing signal R_S is generated in the read strobing signal generating circuit 121 may be set in various ways according to embodiments. The read strobing signal generating circuit 121 may be connected to the read input signal generating circuit 123 and the read strobing signal delay circuit 125 to supply the read strobing signal R_S to the read input signal generating circuit 123 and the read strobing signal delay circuit 125.

The read input signal generating circuit 123 may generate the first read input signal RPI<1> and the first inverted read input signal RPIB<1>, and then generate the second read input signal RPI<2> and the second inverted read input signal RPIB<2> whenever the read strobing signal R_S is generated. As an example, the read input signal generating circuit 123 may generate a first pulse of the first read input signal RPI<1> and a first pulse of the first inverted read input signal RPIB<1> when a first pulse of the read strobing signal R_S is generated, and generate a second pulse of the second read input signal RPI<2> and a second pulse of the second inverted read input signal RPIB<2> when a second pulse of the read strobing signal R_S is generated.

The read strobing signal delay circuit 125 may delay the read strobing signal R_S by a preset read strobing delay section to generate a delayed read strobing signal R_SD. The read strobing delay section may be set in various ways according to embodiments.

The read output signal generating circuit 127 may generate the first read output signal RPO<1> and the first inverted read output signal RPOB<1>, and then generate the second read output signal RPO<2> and the second inverted read output signal RPOB<2> whenever the delayed read strobing signal R_SD is generated. As an example, the read output signal generating circuit 127 may generate a first pulse of the first read output signal RPO<1> and a first pulse of the first inverted read output signal RPOB<1> when a first pulse of the delayed read strobing signal R_SD is generated, and generate a second pulse of the second read output signal RPO<2> and a second pulse of the second inverted read output signal RPOB<2> when a second pulse of the delayed read strobing signal R_SD is generated.

Figure 3:
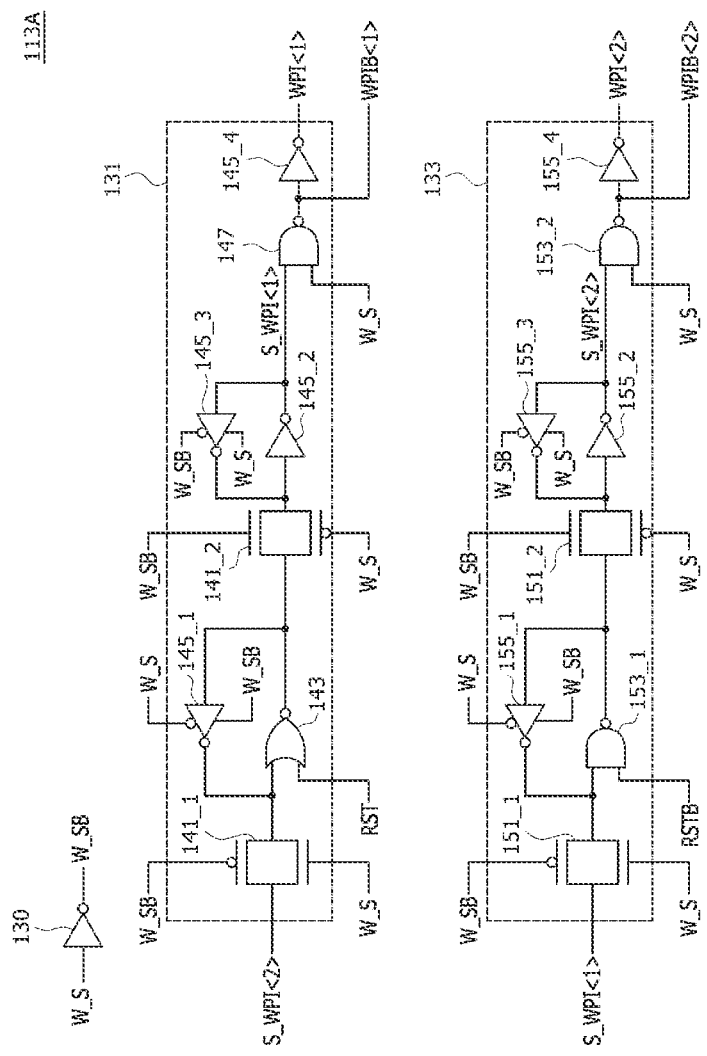
FIG. 3 is a circuit diagram according to an example of a write input signal generating circuit included in the strobing signal generating circuit shown in FIG. 2.

FIG. 3 is a circuit diagram illustrating a write input signal generating circuit 113A according to an example of the write input signal generating circuit 113 shown in FIG. 2. As shown in FIG. 3, the write input signal generating circuit 113A may include an inverter 130 that inversely buffers the write strobing signal W_S to generate an inverted write strobing signal W_SB, a first write input signal generating circuit 131, and a second write input signal generating circuit 133.

The first write input signal generating circuit 131 may include transmission gates 141_1 and 141_2, a NOR gate 143, inverters 145_1, 145_2, 145_3, and 145_4, and a NAND gate 147. The transmission gate 141_1 may transmit a second selection write input signal S_WPI<2> when the write strobing signal W_S is generated at a logic "high" level and the inverted write strobing signal W_SB is generated at a logic "low" level. The NOR gate 143 may receive the signal transmitted from the transmission gate 141_1 and a reset signal RST to perform a NOR operation. The reset signal RST may be activated for an initialization operation. The inverter 145_1 may transmit an output signal of the NOR gate 143 as an input signal of the NOR gate 143 when the write strobing signal W_S is generated at a logic "low" level and the inverted write strobing signal W_SB is generated at a logic "high" level. The transmission gate 141_2 may transmit the output signal of the NOR gate 143 when the write strobing signal W_S is generated at a logic "low" level and the inverted write strobing signal W_SB is generated at a logic "high" level. The inverter 145_2 may inversely buffer an output signal of the transmission gate 141_2, and output an inversely buffered signal of the output signal of the transmission gate 141_2. The inverter 145_3 may inversely buffer an output signal of the inverter 145_2, and transmit an inversely buffered signal of the output signal of the inverter 145_2 as an input signal of the inverter 145_2 when the write strobing signal W_S is generated at a logic "high" level and the inverted write strobing signal W_SB is generated at a logic "low" level. The NAND gate 147 may receive the output signal of the inverter 145_2 and the write strobing signal W_S and perform a NAND operation to generate the first inverted write input signal WPIB<1>. The inverter 145_4 may inversely buffer the first inverted write input signal WPIB<1> to generate the first write input signal WPI<1>.

The first write input signal generating circuit 131 may initialize a first selection write input signal S_WPI<1> to a logic "high" level through the NOR gate 143, the transmission gate 141_1, and the inverter 145_2 when the reset signal RST is activated to a logic "high" level while the write strobing signal W_S is at a logic "low" level. The first write input signal generating circuit 131 may generate a pulse of the first write input signal WPI<1> and a pulse of the first inverted write input signal WPIB<1> through the NAND gate 147 and the inverter 145_4 whenever a pulse of the write strobing signal W_S is received while the first selection write input signal S_WPI<1> is activated to a logic "high" level. The first write input signal generating circuit 131 may set a logic level of the first selection write input signal S_WPI<1> according to the second selection write input signal S_WPI<2> received through the transmission gate 141_1 after the pulse of the write strobing signal W_S is received. The first write input signal generating circuit 131 may generate the first selection write input signal S_WPI<1> having a logic level that is inverted whenever the pulse of the write strobing signal W_S is received. The first write input signal generating circuit 131 may generate the pulse of the first write input signal WPI<1> and the pulse of the first inverted write input signal WPIB<1> whenever an odd-numbered pulse of the write strobing signal W_S is received.

The second write input signal generating circuit 133 may include transmission gates 151_1 and 151_2, NAND gates 153_1 and 153_2, and inverters 155_1, 155_2, 155_3, and 155_4. The transmission gate 151_1 may transmit the first selection write input signal S_WPI<1> when the write strobing signal W_S is generated at a logic "high" level and the inverted write strobing signal W_SB is generated at a logic "low" level. The NAND gate 153_1 may receive the signal transferred from the transmission gate 151_1 and an inverted reset signal RST to perform a NAND operation. The inverter 155_1 may transmit an output signal of the NAND gate 153_1 as an input signal of the NAND gate 153_1 when the write strobing signal W_S is generated at a logic "low" level and the inverted write strobing signal W_SB is generated at a logic "high" level. The transmission gate 151_2 may transmit an output signal of the NAND gate 153_1 when the write strobing signal W_S is generated at a logic "low" level and the inverted write strobing signal W_SB is generated at a logic "high" level. The inverter 155_2 may inversely buffer an output signal of the transmission gate 151_2, and output an inversely buffered signal of the output signal of the transmission gate 141_2. The inverter 155_3 may inversely buffer an output signal of the inverter 155_2, and transmit an inversely buffered signal of the output signal of the inverter 155_2 as an input signal of the inverter 155_2 when the write strobing signal W_S is generated at a logic "high" level and the inverted write strobing signal W_SB is generated at a logic "low" level. The NAND gate 153_2 may receive an output signal of the inverter 155_3 and the write strobing signal W_S and perform a NAND operation to generate the second inverted write input signal WPIB<2>. The inverter 155_4 may inversely buffer the second inverted write input signal WPIB<2> to generate the second write input signal WPI<2>.

The second write input signal generating circuit 133 may initialize the second selection write input signal S_WPI<2> to a logic "low" level through the NAND gate 153_1, the transmission gate 151_1, and the inverter 155_2 when the reset signal RST is activated to a logic "high" level while the write strobing signal W_S is at a logic "low" level. The second write input signal generating circuit 133 may generate a pulse of the second write input signal WPI<2> and a pulse of the second inverted write input signal WPIB<2> through the NAND gate 153_2 and the inverter 155_4 whenever the pulse of the write strobing signal W_S is received while the second selection write input signal S_WPI<2> is activated to a logic "high" level. The second write input signal generating circuit 133 may set a logic level of the second selection write input signal S_WPI<2> according to the first selection write input signal S_WPI<1> received through the transmission gate 151_1 after the pulse of the write strobing signal W_S is received. The second write input signal generating circuit 133 may generate the second selection write input signal S_WPI<2> having a logic level that is inverted whenever the pulse of the write strobing signal W_S is received. The second write input signal generating circuit 133 may generate the pulse of the second write input signal WPI<2> and the pulse of the second inverted write input signal WPIB<2> whenever an even-numbered pulse of the write strobing signal W_S is received.

Figure 4:
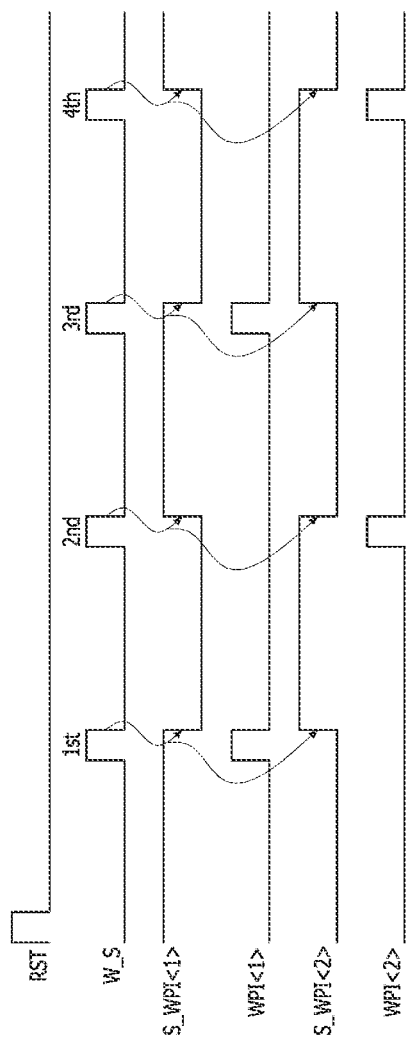
FIG. 4 is a timing diagram illustrating an operation of the write input signal generating circuit shown in FIG. 3.

FIG. 4 is a timing diagram illustrating an operation of the write input signal generating circuit 113A shown in FIG. 3. As shown in FIG. 4, when the reset signal RST is activated to a logic "high" level while the write strobing signal W_S is at a logic "low" level, the first selection write input signal S_WPI<1> may be initialized to a logic "high" level and the second selection write input signal S_WPI<2> may be initialized to a logic "low" level. When a first pulse 1st of the write strobing signal W_S is received, a first pulse of the first write input signal WPI<1> and a first pulse of the first inverted write input signal WPIB<1> may be generated. After the first pulse of the first write input signal WPI<1> and the first pulse of the first inverted write input signal WPIB<1> are generated, the first selection write input signal S_WPI<1> may transition from a logic "high" level to a logic "low" level, and the second selection write input signal S_WPI<2> may transition from a logic "low" level to a logic "high" level. When a second pulse 2nd of the write strobing signal W_S is received, a first pulse of the second write input signal WPI<2> and a first pulse of the second inverted write input signal WPIB<2> may be generated. After the first pulse of the second write input signal WPI<2> and the first pulse of the second inverted write input signal WPIB<2> are generated, the first selection write input signal S_WPI<1> may transition from a logic "low" level to a logic "high" level, and the second selection write input signal S_WPI<2> may transition from a logic "high" level to a logic "low" level. When a third pulse 3rd of the write strobing signal W_S is received, a second pulse of the first write input signal WPI<1> and a second pulse of the first inverted write input signal WPIB<1> may be generated. After the second pulse of the first write input signal WPI<1> and the second pulse of the first inverted write input signal WPIB<1> are generated, the first selection write input signal S_WPI<1> may transition from a logic "high" level to a logic "low" level, and the second selection write input signal S_WPI<2> may transition from a logic "low" level to a logic "high" level. When a fourth pulse 4th of the write strobing signal W_S is received, a second pulse of the second write input signal WPI<2> and a second pulse of the second inverted write input signal WPIB<2> may be generated. After the second pulse of the second write input signal WPI<2> and the second pulse of the second inverted write input signal WPIB<2> are generated, the first selection write input signal S_WPI<1> may transition from a logic "low" level to a logic "high" level, and the second selection write input signal S_WPI<2> may transition from a logic "high" level to a logic "low" level.

Figure 5:
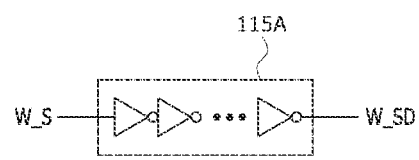
FIG. 5 is a circuit diagram according to an example of a write delay circuit included in the strobing signal generating circuit shown in FIG. 2.

FIG. 5 is a circuit diagram of a write strobing signal delay circuit 115A according to an example of the write strobing signal delay circuit 115 shown in FIG. 2. As shown in FIG. 5, the write strobing signal delay circuit 115A may be implemented with an inverter chain. The number of inverters included in the inverter chain may be determined according to the write strobing delay section.

Figure 6:
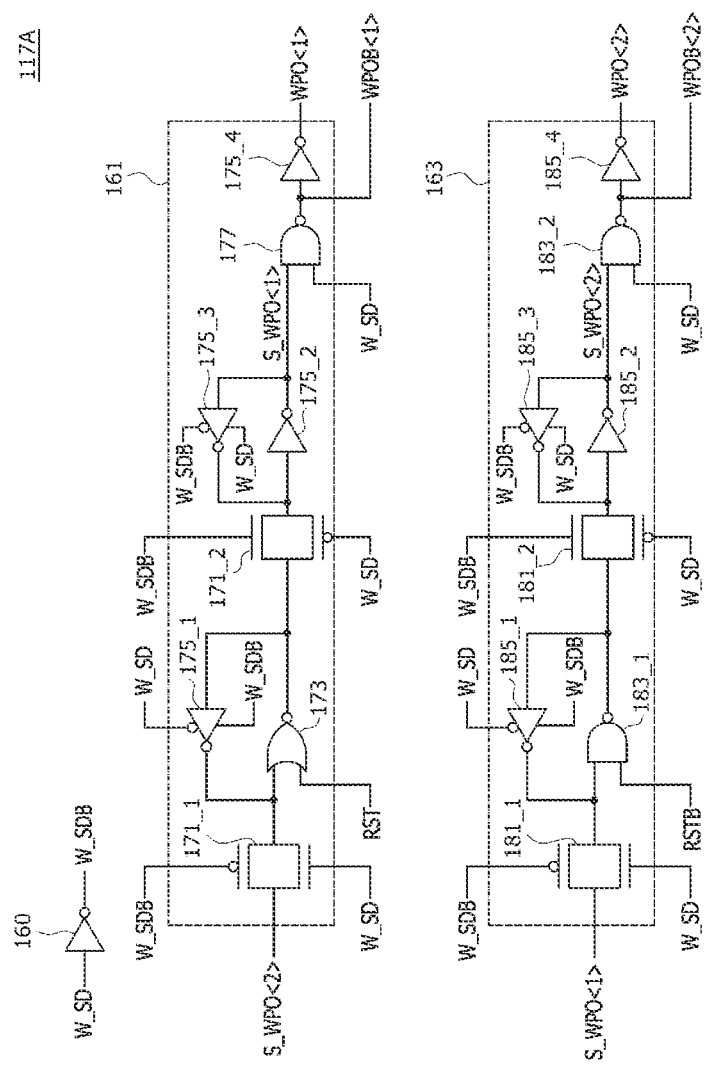
FIG. 6 is a circuit diagram according to an example of a write output signal generating circuit included in the strobing signal generating circuit shown in FIG. 2.

FIG. 6 is a circuit diagram of a write output signal generating circuit 117A according to an example of the write output signal generating circuit 117 shown in FIG. 2. As shown in FIG. 6, the write output signal generating circuit 117A may include an inverter 160 that inversely buffers the delayed write strobing signal W_SD to generate the inverted delayed write strobing signal W_SDB, a first write output signal generating circuit 161, and a second write output signal generating circuit 163.

The first write output signal generating circuit 161 may include transmission gates 171_1 and 171_2, a NOR gate 173, inverters 175_1, 175_2, 175_3, and 175_4, and a NAND gate 177. The transmission gate 171_1 may transmit a second selection write output signal S_WPO<2> when the delayed write strobing signal W_SD is generated at a logic "high" level and the inverted delayed write strobing signal W_SDB is generated at a logic "low" level. The NOR gate 173 may receive a signal transmitted from the transmission gate 171_1 and the reset signal RST to perform a NOR operation. The inverter 175_1 may transmit an output signal of the NOR gate 173 as an input signal of the NOR gate 173 when the delayed write strobing signal W_SD is generated at a logic "low" level and the inverted delayed write strobing signal W_SDB is generated at a logic "high" level. The transmission gate 171_2 may transmit the output signal of the NOR gate 173 when the delayed write strobing signal W_SD is generated at a logic "low" level and the inverted delayed write strobing signal W_SDB is generated at a logic "high" level. The inverter 175_2 may inversely buffer an output signal of the transmission gate 171_2 to output an inversely buffered signal of the output signal of the transmission gate 171_2. The inverter 175_3 may inversely buffer an output signal of the inverter 175_2 to transmit the inversely buffered signal of the output signal of the inverter 175_2 as an input signal of the inverter 175_2 when the delayed write strobing signal W_SD is generated at a logic "high" level and the inverted delayed write strobing signal W_SDB is generated at a logic "low" level. The NAND gate 177 may receive a signal transferred from the transmission gate 171_2 and the delayed write strobing signal W_SD, and perform a NAND operation to generate the first inverted write output signal WPOB<1>. The inverter 175_4 may inversely buffer the first inverted write output signal WPOB<1> to generate the first write output signal WPO<1>.

The first write output signal generating circuit 161 may initialize the first selection write output signal S_WPO<1> to a logic "high" level through the NOR gate 173, the transmission gate 171_1, and the inverter 175_2 when the reset signal RST is activated at a logic "high" level while the delayed write strobing signal W_SD is at a logic "low" level. The first write output signal generating circuit 161 may generate a pulse of the first write output signal WPO<1> and a pulse of the first inverted write output signal WPOB<1> through the NAND gate 177 and the inverter 175_2 whenever a pulse of the delayed write strobing signal W_SD is received while the first selection write output signal S_WPO<1> is activated to a logic "high" level. The first write output signal generating circuit 161 may set a logic level of the first selection write output signal S_WPO<1> according to the second selection write output signal S_WPO<2> received through the transmission gate 171_1 after the pulse of the delayed write strobing signal W_SD is received. The first write output signal generating circuit 161 may generate the first selection write output signal S_WPO<1> having a logic level that is inverted whenever the pulse of the delayed write strobing signal W_SD is received. The first write output signal generating circuit 161 may generate the pulse of the first write output signal WPO<1> and the pulse of the first inverted write output signal WPOB<1> whenever an odd-numbered pulse of the delayed write strobing signal W_SD is received.

The second write output signal generating circuit 163 may include transmission gates 181_1 and 181_2, NAND gates 183_1 and 183_2, and inverters 185_1, 185_2, 185_3, and 185_4. The transmission gate 181_1 may transmit the first selection write output signal S_WPO<1> when the delayed write strobing signal W_SD is generated at a logic "high" level and the inverted delayed write strobing signal W_SDB is generated at a logic "low" level. The NAND gate 183_1 may receive a signal transferred from the transmission gate 181_1 and the inverted reset signal RSTB to perform a NAND operation. The inverter 185_1 may transmit an output signal of the NAND gate 183_1 as an input signal of the NAND gate 183_1 when the delayed write strobing signal W_SD is generated at a logic "high" level and the inverted delayed write strobing signal W_SDB is generated at a logic "low" level. The transmission gate 181_2 may transmit the output signal of the NAND gate 183_1 when the delayed write strobing signal W_SD is generated at a logic "low" level and the inverted delayed write strobing signal W_SDB is generated at a logic "high" level. The inverter 185_2 may inversely buffer an output signal of the transmission gate 181_2 to output an inversely buffered signal of the output signal of the transmission gate 181_2. The inverter 185_3 may inversely buffer an output signal of the inverter 185_2 to transmit an inversely buffered signal of the output signal of the inverter 185_2 as an input signal of the inverter 185_2 when the delayed write strobing signal W_SD is generated at a logic "high" level and the inverted delayed write strobing signal W_SDB is generated at a logic "low" level. The NAND gate 183_2 may receive an output signal of the inverter 185_3 and the delayed write strobing signal W_SD and perform a NAND operation to generate the second inverted write output signal WPOB<2>. The inverter 185_4 may inversely buffer the second inverted write output signal WPOB<2> to generate a second write output signal WPO<2>.

The second write output signal generating circuit 163 may initialize the second selection write output signal S_WPO<2> through the NAND gate 183_1 and the transmission gate 171_2 when the reset signal RST is activated at a logic "high" level while the delay write strobing signal W_SD is at a logic "low" level. The second write output signal generating circuit 163 may generate a pulse of the second write output signal WPO<2> and a pulse of the second inverted write output signal WPOB<2> through the NAND gate 183_2 and the inverter 185_4 whenever a pulse of the delayed write strobing signal W_SD is received while the second selection write output signal S_WPO<2> is activated at a logic "high" level. The second write output signal generating circuit 163 may set a logic level of the second selection write output signal S_WPO<2> according to the first selection write output signal S_WPO<2> received through the transmission gate 181_1 after the pulse of the delayed write strobing signal W_SD is received. The second write output signal generating circuit 163 may generate the second selection write output signal S_WPO<2> having a logic level that is inverted whenever the pulse of the delayed write strobing signal W_SD is received. The second write output signal generating circuit 163 may generate the pulse of the second write output signal WPO<2> and the pulse of the second inverted write output signal WPOB<2> whenever an even-numbered pulse of the delayed write strobing signal W_SD is received.

Figure 7:
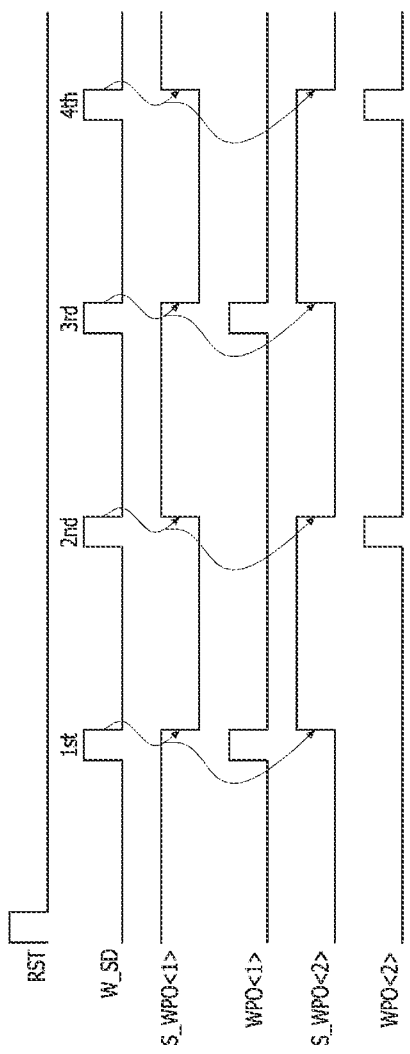
FIG. 7 is a timing diagram illustrating an operation of the write output signal generating circuit shown in FIG. 6.

FIG. 7 is a timing diagram illustrating an operation of the write output signal generating circuit 117A shown in FIG. 6. As shown in FIG. 7, when the reset signal RST is activated at a logic "high" level while the delayed write strobing signal W_SD is at a logic "low" level, the first selection write output signal S_WPO<1> may be initialized to a logic "high" level, and the second selection write output signal S_WPO<2> may be initialized to a logic "low" level. When a first pulse 1st of the delayed write strobing signal W_SD is received, a first pulse of the first write output signal WPO<1> and a first pulse of the first inverted write output signal WPOB<1> may be generated. After the first pulse of the first write output signal WPO<1> and the first pulse of the first inverted write output signal WPOB<1> are generated, the first selection write output signal S_WPO<1> may transition from a logic "high" level to a logic "low" level, and the second selection write output signal S_WPO<2> may transition from a logic "low" level to a logic "high" level. When the second pulse 2nd of the delayed write strobing signal W_SD is received, a first pulse of the second write output signal WPO<2> and a first pulse of the second inverted write output signal WPOB<2> may be generated. After the first pulse of the second write output signal WPO<2> and the first pulse of the second inverted write output signal WPOB<2> are generated, the first selection write output signal S_WPO<1> may transition from a logic "low" level to a logic "high" level, and the second selection write output signal S_WPO<2> may transition from a logic "high" level to a logic "low" level. When a third pulse 3rd of the delayed write strobing signal W_SD is received, a second pulse of the first write output signal WPO<1> and a second pulse of the first inverted write output signal WPOB<1> may be generated. After the second pulse of the first write output signal WPO<1> and the second pulse of the first inverted write output signal WPOB<1> are generated, the first selection write output signal S_WPO<1> may transition from a logic "high" level to a logic "low" level, and the second selection write output signal S_WPO<2> may transition from a logic "low" level to a logic "high" level. When a fourth pulse 4th of the delayed write strobing signal W_SD is received, a second pulse of the second write output signal WPO<2> and a second pulse of the second inverted write output signal WPOB<2> may be generated. After the second pulse of the second write output signal WPO<2> and the second pulse of the second inverted write output signal WPOB<2> are generated, the first selection write output signal S_WPO<1> may transition from a logic "low" level to a logic "high" level, and the second selection write output signal S_WPO<2> may transition from a logic "high" level to a logic "low" level.

Figure 8:
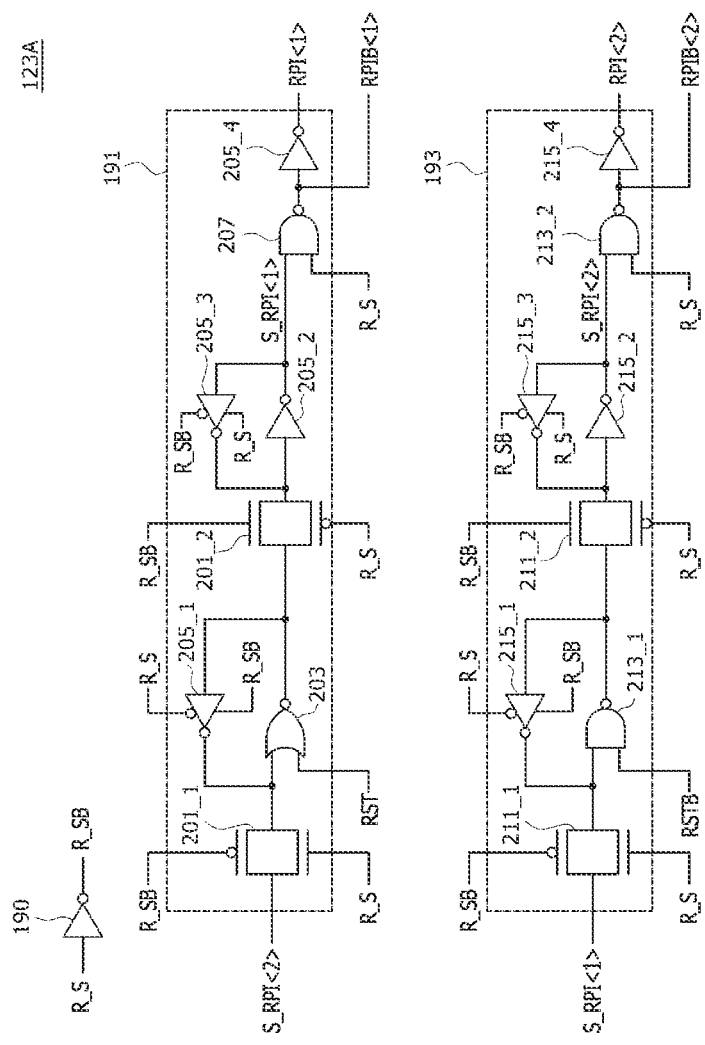
FIG. 8 is a circuit diagram according to an example of a read input signal generating circuit included in the strobing signal generating circuit shown in FIG. 2.

FIG. 8 is a circuit diagram of a read input signal generating circuit 123A according to an example of the read input signal generating circuit 123 shown in FIG. 2. As shown in FIG. 8, the read input signal generating circuit 123A may include an inverter 190 that inversely buffers a read strobing signal R_S to generate an inverted read strobing signal R_SB, a first read input signal generating circuit 191, and a second read input signal generating circuit 193.

The first read input signal generating circuit 191 may include transmission gates 201_1 and 201_2, a NOR gate 203, inverters 205_1, 205_2, 205_3, and 205_4, and a NAND gate 207. The transmission gate 201_1 may transmit a second selection read input signal S_RPI<2> when the read strobing signal R_S is generated at a logic "high" level and the inverted read strobing signal R_SB is generated at a logic "low" level. The NOR gate 203 may receive a signal transmitted from the transmission gate 201_1 and the reset signal RST to perform a NOR operation. The reset signal RST may be activated for an initial operation. The inverter 205_1 may transmit an output signal of the NOR gate 203 as an input signal of the NOR gate 203 when the read strobing signal R_s is generated at a logic "low" level and the inverted read strobing signal R_SB is generated at a logic "high" level. The transmission gate 201_2 may transmit the output signal of the NOR gate 203 when the read strobing signal R_S is generated at a logic "low" level and the inverted read strobing signal R_SB is generated at a logic "high" level. The inverter 205_2 may inversely buffer an output signal of the transmission gate 201_2 to output an inversely buffered signal of the output signal of the transmission gate 201_2. The inverter 205_3 may inversely buffer an output signal of the inverter 205_2 to transmit an inversely buffered signal of the output signal of the inverter 205_2 as an input signal of the inverter 205_2 when the read strobing signal R_S is generated at a logic "high" level and the inverted read strobing signal R_SB is generated at a logic "low" level. The NAND gate 207 may receive the output signal of the inverter 205_2 and the read strobing signal R_S, and perform a NAND operation to generate the first inverted read input signal RPIB<1>. The inverter 205_2 may inversely buffer the first inverted read input signal RPIB<1> to generate the first read input signal RPI<1>.

The first read input signal generating circuit 191 may initialize the first selection read input signal S_RPI<1> through the NOR gate 203, the transmission gate 201_1, and the inverter 205_2 when the reset signal RST is activated at a logic "high" level while the read strobing signal R_S is at a logic "low" level. The first read input signal generating circuit 191 may generate a pulse of the first read input signal RPI<1> and a pulse of the first inverted read input signal RPIB<1> whenever a pulse of the read strobing signal R_S is received while the first selection read input signal S_RPI<1> is activated at a logic "high" level. The first read input signal generating circuit 191 may set a logic level of the first selection read input signal S_RPI<1> according to the second selection read input signal S_RPI<2> received through the transmission gate 201_1 after the pulse of the read strobing signal R_S is received. The first read input signal generating circuit 191 may generate the first selection read input signal S_RPI<1> having a logic level that is inverted whenever the pulse of the read strobing signal R_S is received. The first read input signal generating circuit 191 may generate the pulse of the first read input signal RPI<1> and the pulse of the first inverted read input signal RPIB<1>.

The second read input signal generating circuit 193 may include transmission gates 211_1 and 211_2, NAND gates 213_1 and 213_2, and inverters 215_1, 215_2, 215_3, and 215_4. The transmission gate 211_1 may transmit the first selection read input signal S_RPI<1> when the read strobing signal R_S is generated at a logic "high" level and the inverted read strobing signal R_SB is generated at a logic "low" level. The NAND gate 213_1 may receive a signal transmitted from the transmission gate 211_1 and the inverted reset signal RSTB to perform a NAND operation. The inverter 251_1 may transmit an output signal of the NAND gate 213_1 as an input signal of the NAND gate 213_1 when the read strobing signal R_S is generated at a logic "low" level and the inverted read strobing signal R_SB is generated at a logic "high" level. The transmission gate 211_2 may transmit the output signal of the NAND gate 213_1 when the read strobing signal R_S is generated at a logic "low" level and the inverted read strobing signal R_SB is generated at a logic "high" level. The inverter 215_2 may inversely buffer an output signal of the transmission gate 211_2 to output an inversely buffered signal of the output signal of the transmission gate 211_2. The inverter 215_3 may inversely buffer an output signal of the inverter 215_2 to transmit an inversely buffered signal of the output signal of the inverter 215_2 as an input signal of the inverter 215_2 when the read strobing signal R_S is generated at a logic "high" level and the inverted read strobing signal R_SB is generated at a logic "low" level. The NAND gate 213_2 may receive an output signal of the inverter 215_3 and the read strobing signal R_s, and perform a NAND operation to generate the second inverted read input signal RPIB<2>.

The inverter 215_4 may inversely buffer the second inverted read input signal RPIB<2> to generate the second read input signal RPI<2>.

The second read input signal generating circuit 193 may initialize the second selection read input signal S_RPI<2> to a logic "low" level through the NAND gate 213_1, the transmission gate 211_1, and the inverter 215_2 when the reset signal RST is activated at a logic "high" level while the read strobing signal R_S is at a logic "low" level. The second read input signal generating circuit 193 may generate a pulse of the second read input signal RPI<2> and a pulse of the second inverted read input signal RPIB<2> through the NAND gate 213_2 and the inverter 215_4 whenever a pulse of the read strobing signal R_S is received while the second selection read input signal S_RPI<2> is activated at a logic "high" level. The second read input signal generating circuit 193 may set a logic level of the second selection read input signal S_RPI<2> according to the first selection read input signal S_RPI<1> received through the transmission gate 211_1 after the pulse of the read strobing signal R_S is received. The second read input signal generating circuit 193 may generate the second selection read input signal S_RPI<2> having a logic level that is inverted whenever the pulse of the read strobing signal R_S is received. The second read input signal generating circuit 193 may generate the pulse of the second read input signal RPI<2> and the pulse of the second inverted read input signal RPIB<2> whenever an even-numbered pulse of the read strobing signal R_S is received.

Figure 9:
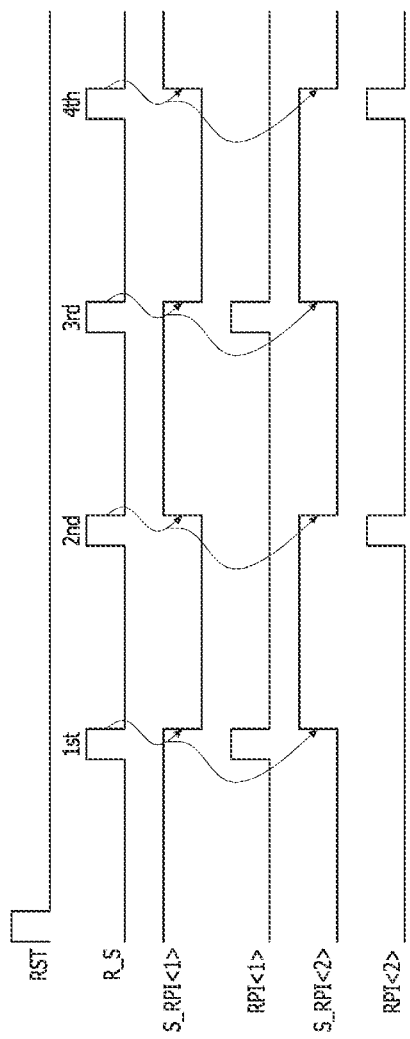
FIG. 9 is a timing diagram illustrating an operation of the read input signal generating circuit shown in FIG. 6.

FIG. 9 is a timing diagram illustrating an operation of the read input signal generating circuit 123A shown in FIG. 8. As shown in FIG. 9, when the reset signal RST is activated at a logic "high" level while the read strobing signal R_S is at a logic "low" level, the first selection read input signal S_RPI<1> may be initialized to a logic "high" level, and the second selection read input signal S_RPI<2> may be initialized to a logic "low" level. When the first pulse 1st of the read strobing signal R_S is received, a first pulse of the first read input signal RPI<1> and a first pulse of the first inverted read input signal RPIB<1> may be generated. After the first pulse of the first read input signal RPI<1> and the first pulse of the first inverted read input signal RPIB<1> are generated, the first selection read input signal S_RPI<1> may transition from a logic "high" level to a logic "low" level, and the second selection read input signal S_RPI<2> may transition from a logic "low" level to a logic "high" level. When a second pulse 2nd of the read strobing signal R_S is received, a first pulse of the second read input signal RPI<2> and a first pulse of the second inverted read input signal RPIB<2> may be generated. After the first pulse of the second read input signal RPI<2> and the first pulse of the second inverted read input signal RPIB<2> are generated, the first selection read input signal S_RPI<1> may transition from a logic "low" level to a logic "high" level, and the second selection read input signal S_RPI<2> may transition from a logic "high" level to a logic "low" level. When a third pulse 3rd of the read strobing signal R_S is received, a second pulse of the first read input signal RPI<1> and a second pulse of the first inverted read input signal RPIB<1> may be generated. After the second pulse of the first read input signal RPI<1> and the second pulse of the first inverted read input signal RPIB<1> are generated, the first select read input signal S_RPI<1> may transition from a logic "high" level to a logic "low" level, and the second select read input signal S_RPI<2> may transition from a logic "low" level to a logic "high" level. When a fourth pulse 4th of the read strobing signal R_S is received, a second pulse of the second read input signal RPI<2> and a second pulse of the second inverted read input signal RPIB<2> may be generated. After the second pulse of the second read input signal RPI<2> and the second pulse of the second inverted read input signal RPIB<2> are generated, the first selection read input signal S_RPI<1> may transition from a logic "low" level to a logic "high" level, and the second selection read input signal S_RPI<2> may transition from a logic "high" level to a logic "low" level.

Figure 10:
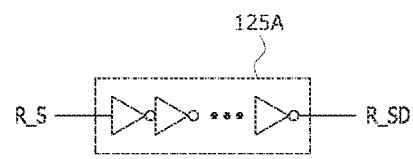
FIG. 10 is a circuit diagram according to an example of a read delay circuit included in the strobing signal generating circuit shown in FIG. 2.

FIG. 10 is a circuit diagram of a read strobing signal delay circuit 125A according to an example of the read strobing signal delay circuit 125 shown in FIG. 2. as shown in FIG. 10, the read strobing signal delay circuit 125A may be implemented as an inverter chain. The number of inverters included in the inverter chain may be determined by the read strobing delay period.

Figure 11:
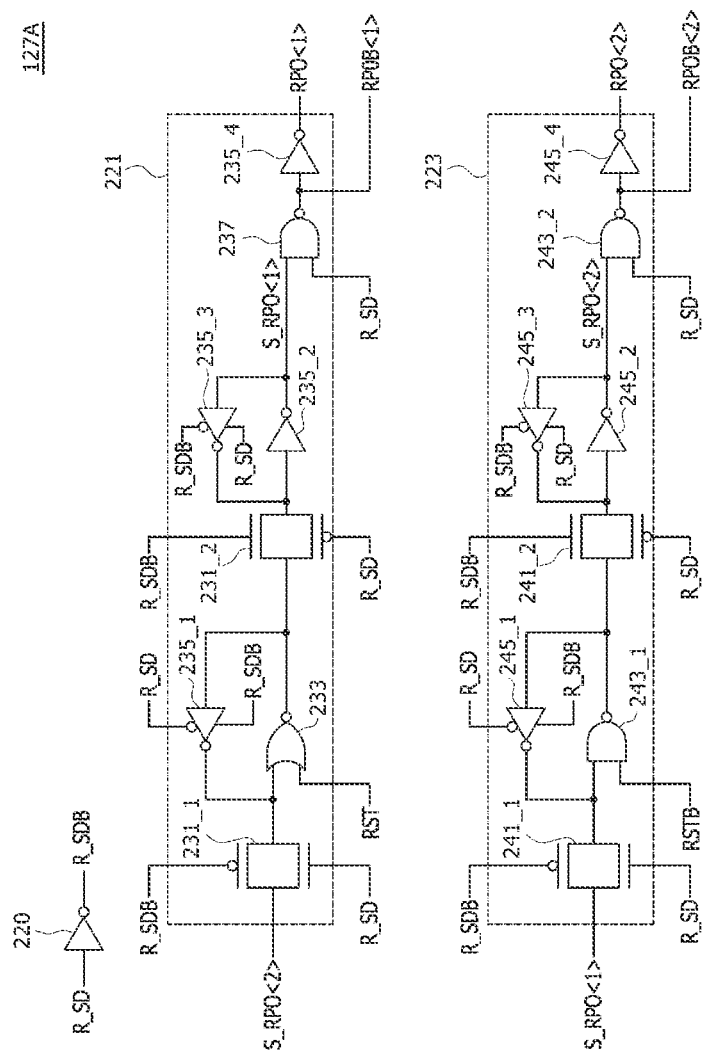
FIG. 11 is a circuit diagram according to an example of a read output signal generating circuit included in the strobing signal generating circuit shown in FIG. 2.

FIG. 11 is a circuit diagram of a read output signal generating circuit 127A according to an example of the read output signal generating circuit 127 shown in FIG. 2. As shown in FIG. 11, the read output signal generating circuit 127A may include an inverter 220 that inversely buffers the delayed read strobing signal R_SD to generate an inverted delayed read strobing signal R_SB, a first read output signal generating circuit 221, and a second read output signal generating circuit 223.

The first read output signal generating circuit 221 may include transmission gates 231_1 and 231_2, a NOR gate 233, inverters 235_1, 235_2, 235_3, and 235_4, and a NAND gate 237. The transmission gate 231_1 may transmit the second selection read output signal S_RPO<2> when the delayed read strobing signal R_SD is generated at a logic "high" level and the inverted delayed read strobing signal R_SDB is generated at a logic "low" level. The NOR gate 233 may receive a signal transmitted from the transmission gate 231_1 and the reset signal RST to perform a NOR operation. The inverter 235_1 may transmit an output signal of the NOR gate 233 as an input signal of the NOR gate 233 when the delayed read strobing signal R_SD is generated at a logic "low" level and the inverted delayed read strobing signal R_SDB is generated at a logic "high" level. The transmission gate 231_2 may transmit the output signal of the NOR gate 233 when the delayed read strobing signal R_SD is generated at a logic "low" level and the inversely delayed read strobing signal R_SDB is generated at a logic "high" level. The inverter 235_2 may inversely buffer an output signal of the transmission gate 231_2 to output an inversely buffered signal of the output signal of the transmission gate 231_2. The inverter 235_3 may inversely buffer an output signal of the inverter 235_2 to transmit an inversely buffered signal of the output signal of the inverter 235_2 as an input signal of the inverter 235_2 when the delayed read strobing signal R_SD is generated at a logic "high" level and the inverted delayed read strobing signal R_SDB is generated at a logic "low" level. The NAND gate 237 may receive an output signal of the inverter 235_3 and the delayed read strobing signal R_SD, and perform a NAND operation to generate the first inverted read output signal WPOB<1>. The inverter 235_2 may inversely buffer the first inverted read output signal WRPOB<1> to generate the first read output signal WPO<1>.

The first read output signal generating circuit 221 may initialize the first selection read output signal S_RPO<1> to a logic "high" level through the NOR gate 233, the transmission gate 231_1, and the inverter 235_2 when the reset signal RST is activated at a logic "high" level while the delay read strobing signal R_SD is at a logic "low" level. The first read output signal generating circuit 221 may generate a pulse of the first read output signal WPO<1> and a pulse of the first inverted read output signal WPOB<1> through the NAND gate 237 and the inverter 235_4 whenever a pulse of the delayed read strobing signal R_SD is received while the first selection read output signal S_RPO<1> is activated at a logic "high" level. The first read output signal generating circuit 221 may set a logic level of the first selection read output signal S_RPO<1> according to the second selection read output signal S_RPO<2> received through the transmission gate 231_1 after the pulse of the delayed read strobing signal R_SD is received. The first read output signal generating circuit 221 may generate the first selection read output signal S_RPO<1> having a logic level that is inverted whenever the pulse of the delayed read strobing signal R_SD is received. The first read output signal generating circuit 221 may generate a pulse of the first read output signal WPO<1> and a pulse of the first inverted read output signal WPOB<1> whenever an odd-numbered pulse of the delayed read strobing signal R_SD is received.

The second read output signal generating circuit 223 may include transmission gates 241_1 and 241_2, NAND gates 243_1 and 243_2, and inverters 245_1, 245_2, 245_3, and 245_4. The transmission gate 241_1 may transmit the first selection read output signal S_RPO<1> when the delayed read strobing signal R_SD is generated at a logic "high" level and the inverted delayed read strobing signal R_SDB is generated at a logic "low" level. The NAND gate 243_1 may receive a signal transmitted from the transmission gate 241_1 and the inverted reset signal RSTB to perform a NAND operation. The inverter 245_1 may transmit an output signal of the NAND gate 243_1 as an input signal of the NAND gate 243_1 when the delayed read strobing signal R_SD is generated at a logic "low" level and the inverted delayed read strobing signal R_SD is generated at a logic "high" level. The transmission gate 241_2 may transmit the output signal of the NAND gate 243_1 when the delayed read strobing signal R_SD is generated at a logic "low" level and the inverted delayed read strobing signal R_SD is generated at a logic "high" level. The inverter 245_2 may inversely buffer an output signal of the transmission gate 241_2 to output an inversely buffered signal of the output signal of the transmission gate 241_2. The inverter 245_3 may inversely buffer an output signal of the inverter 245_2 to output an inversely buffered signal of the output signal of the inverter 245_2 as an input signal of the inverter 245_2 when the delayed read strobing signal R_SD is generated at a logic "high" level and the inverted delayed read strobing signal R_SD is generated at a logic "low" level. The NAND gate 243_2 may receive an output signal of the inverter 245_3 and the delayed read strobing signal R_SD, and perform a NAND operation to generate the second inverted read output signal RPOB<2>. The inverter 245_4 may inversely buffer the second inverted read output signal RPOB<2> to generate the second read output signal RPO<2>.

The second read output signal generating circuit 223 may initialize the second selection read output signal S_RPO<2> to a logic "low" level through the NAND gate 243_1, the transmission gate 241_1, and the inverter 245_2 when the reset signal RST is activated at a logic "high" level while the delayed read strobing signal R_SD is at a logic "low" level. The second read output signal generating circuit 223 may generate a pulse of the second read output signal RPO<2> and a pulse of the second inverted read output signal RPOB<2> through the NAND gate 243_2 and the inverter 245_4 whenever a pulse of the delayed read strobing signal R_SD is received while the second selection read output signal S_RPO<2> is activated at a logic "high" level. The second read output signal generating circuit 223 may set a logic level of the second selection read output signal S_RPO<2> according to the first selection read output signal S_RPO<1> received through the transmission gate 241_1 after the pulse of the delayed read strobing signal R_SD is received. The second read output signal generating circuit 223 may generate the second selection read output signal S_RPO<2> having a logic level that is inverted whenever the pulse of the delayed read strobing signal R_SD is received. The second read output signal generating circuit 223 may generate the pulse of the second read output signal RPO<2> and the pulse of second inverted read output signal WPOB<2> whenever an even-numbered pulse of the delayed read strobing signal R_SD is received.

Figure 12:
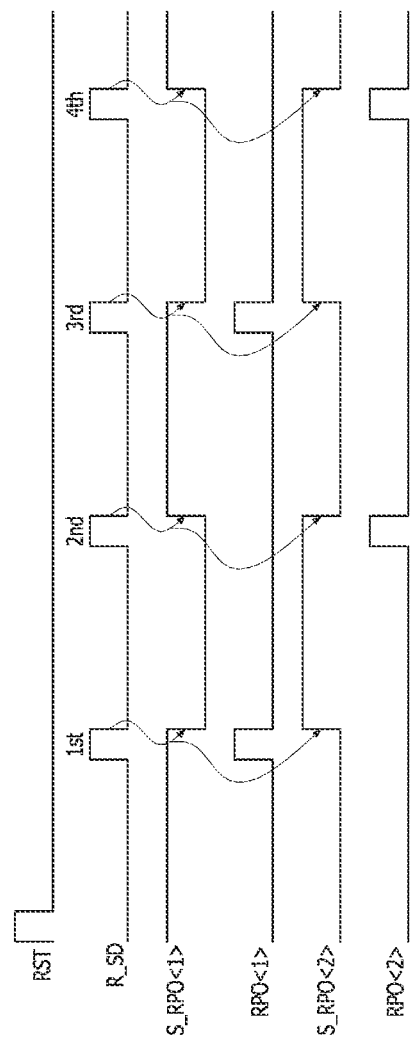
FIG. 12 is a timing diagram illustrating an operation of the read output signal generating circuit shown in FIG. 11.

FIG. 12 is a timing diagram illustrating an operation of the read output signal generating circuit 127A shown in FIG. 11. As shown in FIG. 12, when the reset signal RST is activated at a logic "high" level while the delay read strobing signal R_SD is at a logic "low" level, the first selection read output signal S_RPO<1> may be initialized to a logic "high" level, and the second selection read output signal S_RPO<2> may be initialized to a logic "low" level. When a first pulse 1st of the delayed read strobing signal R_SD is received, a first pulse of the first read output signal WPO<1> and a first pulse of the first inverted read output signal WPOB<1> may be received. After the first pulse of the first read output signal WPO<1> and the first pulse of the first inverted lead output signal WPOB<1> are generated, the first selection read output signal S_RPO<1> may transition from a logic "high" level to a logic "low" level, and the second selection read output signal S_RPO<2> may transition from a logic "low" level to a logic "high" level. When a second pulse 2nd of the delayed read strobing signal R_SD is received, a first pulse of the second read output signal WPO<2> and a first pulse of the second inverted read output signal WPOB<2> may be generated. After the first pulse of the second read output signal WPO<2> and the first pulse of the second inverted read output signal WPOB<2> are generated, the first selection read output signal S_RPO<1> may transition from a logic "low" level to a logic "high" level, and the second select read output signal S_RPO<2> may transition from a logic "high" level to a logic "low" level. When a third pulse 3rd of the delayed read strobing signal R_SD is received, a second pulse of the first read output signal WPO<1> and a second pulse of the first inverted read output signal WPOB<1> may be generated. After the second pulse of the first read output signal WPO<1> and the second pulse of the first inverted read output signal WPOB<1> are generated, the first selection read output signal S_RPO<1> may transition from a logic "high" level to a logic "low" level, and the second selection read output signal S_RPO<2> may transition from a logic "low" level to a logic "high" level. When the fourth pulse 4th of the delayed read strobing signal R_SD is received, a second pulse of the second read output signal WPO<2> and a second pulse of the second inverted read output signal WPOB<2> may be generated. After the second pulse of the second read output signal WPO<2> and the second pulse of the second inverted read output signal WPOB<2> are generated, the first selection read output signal S_RPO<1> may transition from a logic "low" level to a logic "high" level, and the second selection read output signal S_RPO<2> may transition from a logic "high" level to a logic "low" level.

Figure 13:
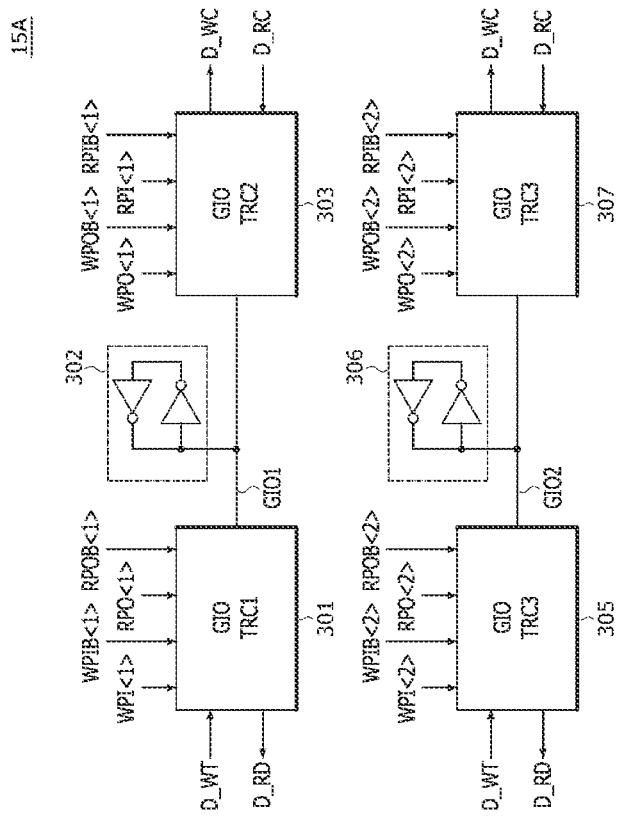
FIG. 13 is a block diagram illustrating a configuration according to an example of an input/output control circuit included in the semiconductor device shown in FIG. 1.

FIG. 13 is a block diagram illustrating a configuration of an input/output control circuit 15A according to an example of the input/output control circuit 15 shown in FIG. 1. As shown in FIG. 13, the input/output control circuit 15A may include a first transceiver 301, a first latch circuit 302, a second transceiver 303, a third transceiver 305, a second latch circuit 306, and a fourth transceiver 307.

The first transceiver 301 may receive the write data D_WT input from the data input/output circuit 19 to output the received write data D_WT to a first global input/output line GIO1 in a write operation, based on the first write input signal WPI<1> and the first inverted write input signal WPIB<1>. The first transceiver 301 may output the read core data D_RC latched in the first global input/output line GIO1 as the read data D_RD in a read operation, based on the first read output signal RPO<1> and the first inverted read output signal RPOB<1>.

The first latch circuit 302 may be connected to the first global input/output line GIO1 to latch data of the first global input/output line GIO1 in a write operation and the read operation. The first latch circuit 302 may latch the write data D_WT output from the first transceiver 301 in the write operation, and supply the latched write data D_WT to the second transceiver 303. The first latch circuit 302 may latch the read core data D_RC output from the fourth transceiver 307 in the read operation, and supply the latched read core data D_RC to the third transceiver 305.

The second transceiver 303 may output the write data D_WT latched in the first global input/output line GIO1 in the write operation as the write core data, based on the first write output data WPO<1> and the inverted write output signal WPOB<1>. The second transceiver 303 may receive the read core data D_RC to output the read core data D_RC to the first global input/output line GIO1, based on the first read input signal RPI<1> and the first inverted read input signal RPIB<1> in the read operation.

The third transceiver 305 may receive the write data D_WT input from the data input/output circuit 19 to output the write data D_WT to a second global input/output line GIO2 in the write operation, based on the second write input signal WPI<2> and the second inverted write input signal WPIB<2>. The third transceiver 305 may output the read core data D_RC latched in the second global input/output line GIO2 as the read data D_RD in the read operation, based on the second read output signal RPO<2> and the second inverted read output signal RPOB<2>.

The second latch circuit 306 may be connected to the second global input/output line GIO2 to latch data of the second global input/output line GIO2 in the write operation and the read operation. The second latch circuit 306 may latch the write data D_WT output from the third transceiver 305 in the write operation, and supply the latched write data D_WT to the fourth transceiver 307. The second latch circuit 306 may latch the read core data D_RC output from the fourth transceiver 307 in the read operation, and supply the latched read core data D_RC to the third transceiver 305.

The fourth transceiver 307 may output the write data D_WT latched in the second global input/output line GIO2 as the write core data D_WC in the write operation, based on the second write output signal WPO<2> and the second inverted write output signal WPOB<2>. The fourth transceiver 307 may receive the read core data D_RC to output the read core data D_RC to the second global input/output line GIO2 in the read operation, based on the second read input data RPI<2> and the second inverted read input signal RPIB<2>.

Figure 14:
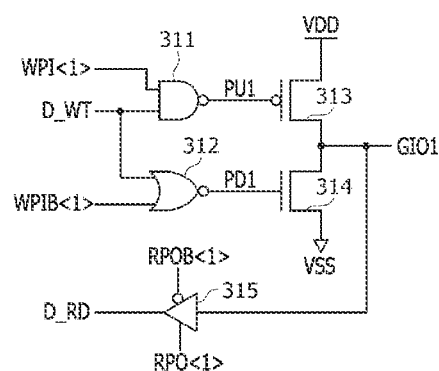
FIG. 14 is a circuit diagram according to an example of a first transceiver included in the input/output control circuit shown in FIG. 13.

FIG. 14 is a circuit diagram of a first transceiver 301A according to an example of the first transceiver 301 shown in FIG. 13. As shown in FIG. 14, the first transceiver 301A may include a NAND gate 311, a NOR gate 312, a PMOS transistor 313, an NMOS transistor 314, and a driver 315. The NAND gate 311 may receive the first write input signal WPI<1> and the write data D_WT, and perform a NAND operation to generate a first pull-up signal PU1. The NOR gate 312 may receive the write data D_WT and the first inverted write input signal WPIB<1>, and perform a NOR operation to generate a first pull-down signal PD1. The PMOS transistor 313 may be turned on based on the first pull-up signal to pull-up drive the first global input/output line GIO1 to a supply voltage VDD. The NMOS transistor 314 may be turned of based on the first pull-down signal PD1 to pull-down drive the first global input/output line GIO1 to a ground voltage VSS. The driver 315 may drive the read data D_RD based on the data loaded on the first global input/output line GIO1 based on the first read output signal RPO<1> and the first inverted read output signal RPOB<1>.

The first transceiver 301A may pull-up drive or pull-down drive the first global input/output line GIO1 according to the write data D_WT when a pulse of the first write input signal WPI<1> and a pulse of the first inverted write input signal WPIB<1> are received in the write operation. The first transceiver 301A may output the read core data D_RC latched in the first global input/output line GIO1 as the read data D_RD in the read operation, based on the first read output signal RPO<1> and the first inverted read output signal RPOB<1>.

Figure 15:
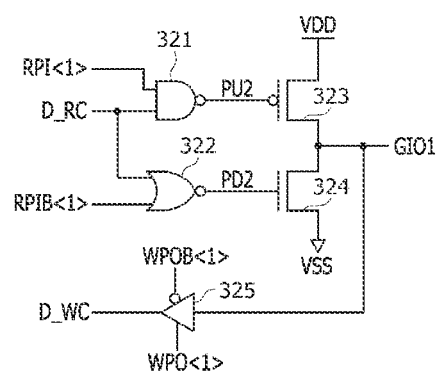
FIG. 15 is a circuit diagram according to an example of a second transceiver included in the input/output control circuit shown in FIG. 13.

FIG. 15 is a circuit diagram of a second transceiver 303A according to an example of the second transceiver 303 shown in FIG. 13. As shown in FIG. 15, the second transceiver 303A may include a NAND gate 321, a NOR gate 322, a PMOS transistor 323, an NMOS transistor 324, and a driver 325. The NAND gate 321 may receive the first read input signal RPI<1> and the read core data D_RC, and perform a NAND operation to generate a second pull-up signal PU2. The NOR gate 322 may receive the read core data D_RC and the first inverted read input signal RPIB<1>, and perform a NOR operation to generate a second pull-down signal PD2. The PMOS transistor 323 may be turned on based on the second pull-up signal PU2 to pull-up drive the first global input/output line GIO1 to the supply voltage VDD. The NMOS transistor 324 may be turned on based on the second pull-down signal PD2 to pull-down drive the first global input/output line GIO1 to the ground voltage VSS. The driver 325 may drive the write core data D_WC, based on the data loaded on the first global input/output line GIO1 based on the first write output signal WPO<1> and the first inverted write output signal WOPB<1>.

The second transceiver 303A may pull-up drive the first global input/output line GIO1 to the supply voltage VDD or pull-down drive the first global input/output line GIO1 to the ground voltage VSS according to the read core data D_RC when a pulse of the first read input signal RPI<1> and a pulse of the first inverted read input signal RPIB<1> are received in the read operation. The second transceiver 303A may output the read core data D_RC latched in the first global input/output line GIO1 as the write core data D_WC in the write operation, based on the first write output signal WPO<1> and the first inverted write output signal WPOB<1>.

Figure 16:
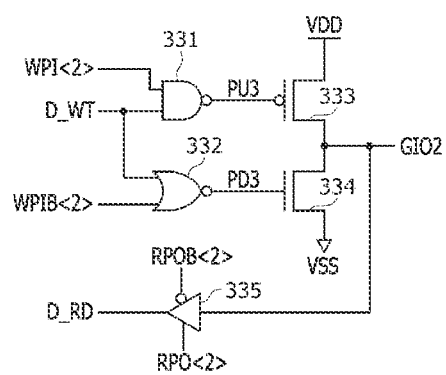
FIG. 16 is a circuit diagram according to an example of a third transceiver included in the input/output control circuit shown in FIG. 13.

FIG. 16 is a circuit diagram of a third transceiver 305A according to an example of the third transceiver 305 shown in FIG. 13. As shown in FIG. 16, the third transceiver 305A may include a NAND gate 331, a NOR gate 334, a PMOS transistor 333, an NMOS transistor 334, and a driver 335. The NAND gate 331 may receive the second write input signal WPI<2> and the write data D_WT, and perform a NAND operation to generate a third pull-up signal PU3. The NOR gate 334 may receive the write data D_WT and the second inverted write input signal WPIB<2>, and perform a NOR operation to generate a third pull-down signal PD3. The PMOS transistor 333 may be turned on based on the third pull-up signal PU3 to pull-up drive the second global input/output line GIO2 to the supply voltage VDD. The NMOS transistor 334 may be turned on based on the third pull-down signal PD3 to pull-down drive the second global input/output line GIO2 to the ground voltage VSS. The driver 335 may drive the read data D_RD, based on the data loaded on the second global input/output line GIO2 based on the second read output signal RPO<2> and the second inverted read output signal RPOB<2>.

The third transceiver 305A may pull-up drive the second global input/output line GIO2 to the supply voltage VDD or pull-down drive the second global input/output line GIO2 to the ground voltage VSS according to the write data D_WT when a pulse of the second write input signal WPI<2> and a pulse of the second inverted write input signal WPIB<2> are received in the write operation. The third transceiver 305A may output the read core data D_RC latched in the second global input/output line GIO2 as the read data D_RD in the read operation, based on the second read output signal RPO<2> and the second inverted read output signal RPOB<2>.

Figure 17:
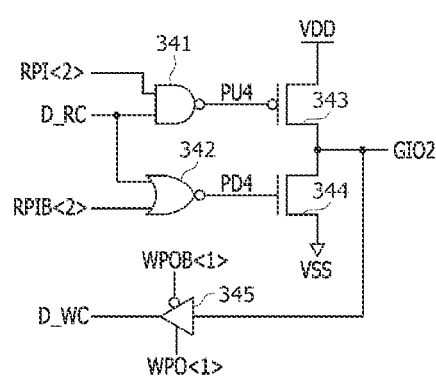
FIG. 17 is a circuit diagram according to an example of a fourth transceiver included in the input/output control circuit shown in FIG. 13.

FIG. 17 is a circuit diagram of a fourth transceiver 307A according to an example of the fourth transceiver 307 shown in FIG. 13. As shown in FIG. 17, the fourth transceiver 307A may include a NAND gate 341, a NOR gate 342, a PMOS transistor 343, an NMOS transistor 344, and a driver 345. The NAND gate 341 may receive the second read input signal RPI<2> and the read core data D_RC, and perform a NAND operation to generate a fourth pull-up signal PU4. The NOR gate 342 may receive the read core data D_RC and the second inverted read input signal RPIB<2>, and perform a NOR operation to generate a fourth pull-down signal PD4. The PMOS transistor 343 may be turned on based on the fourth pull-up signal PU4 to drive the second global input/output line GIO2 to the supply voltage VDD. The NMOS transistor 344 may be turned on based on the fourth pull-down signal PD4 to drive the second global input/output line GIO2 to the ground voltage VSS. The driver 345 may drive the write core data D_WC, based on the data loaded on the second global input/output line GIO2 based on the second write output signal WPO<2> and the second inverted write output signal WPOBB<2>.

The fourth transceiver 307A may pull-up drive the second global input/output line GIO2 to the supply voltage VDD or pull-down the second global input/output line GIO2 to the ground voltage VSS when a pulse of the second read input signal RPI<2> and a pulse of the second inverted read input signal RPIB<2> are received in the read operation. The fourth transceiver 307A may output the read core data D_RC latched in the second global input/output line GIO2 as the write core data D_WC in the write operation, based on the second write output signal WPO<2> and the second inverted write output signal WPOB<2>.

Figure 18:
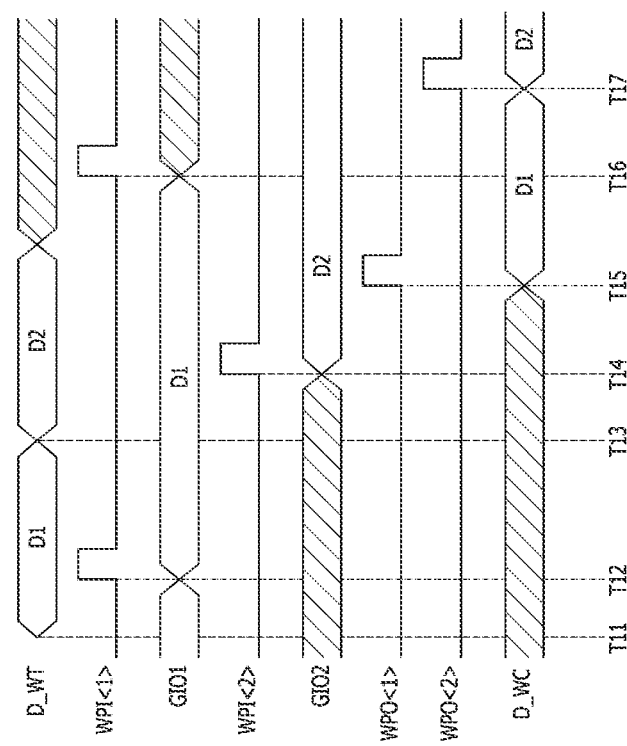
FIGS. 18 and 19 are timing diagrams illustrating operations of the input/output control circuit shown in FIG. 13.

FIG. 18 is a timing diagram illustrating a write operation of the input/output control circuit 15A shown in FIG. 13.

As shown in FIG. 18, at time point T11, write data (D_WT) D1 for a first write operation may be received through the data input/output circuit (19 of FIG. 1), and at time point T13, the write data (D_WT) D2 for the second write operation may be received through the data input/output circuit 19. In addition, as shown in FIG. 18, a first pulse of the first write input signal WPI<1> may be generated by the first write operation at time point T12, a first pulse of the second write input signal WPI<2> may be generated by the second write operation at time point T14, and a second pulse of the first write input signal WPI<1> may be generated by a third write operation at time point T16. In addition, as shown in FIG. 18, a first pulse of the first write output signal WPO<1> may be generated by the first write operation at time point T15, and a first pulse of the second write output signal WPO<2> may be generated by the second write operation at time point T17. In this situation, the data window of the write data (D_WT) D1 for the write operation may be set to a section T11~T13, and the data window of data loaded on the first global input/output line GIO1 may be set to a section T12~T16. Accordingly, the data window of the data loaded on the first global input/output line GIO1 in the continuous write operation may become twice as large as the data window of the write data D_WT received through the data input/output circuit 19 in the write operation. As described above, when the continuous write operation is performed, the first write input signal WPI<1> and the second write input signal WPI<2> may be separately generated, and the first write output signal WPO<1> and the second write output signal WPO<2> may be separately generated. Accordingly, in an embodiment, the data window of the data loaded on the first global input/output line GIO1 may be secured as large as twice, and therefore, a sufficient margin of the data may be secured during data input/output operations. As used herein, the tilde "~" indicates a range of components or time. For example, "T11~T13" indicates the time points T11, T12, and T13 shown in FIG. 18.

Figure 19:
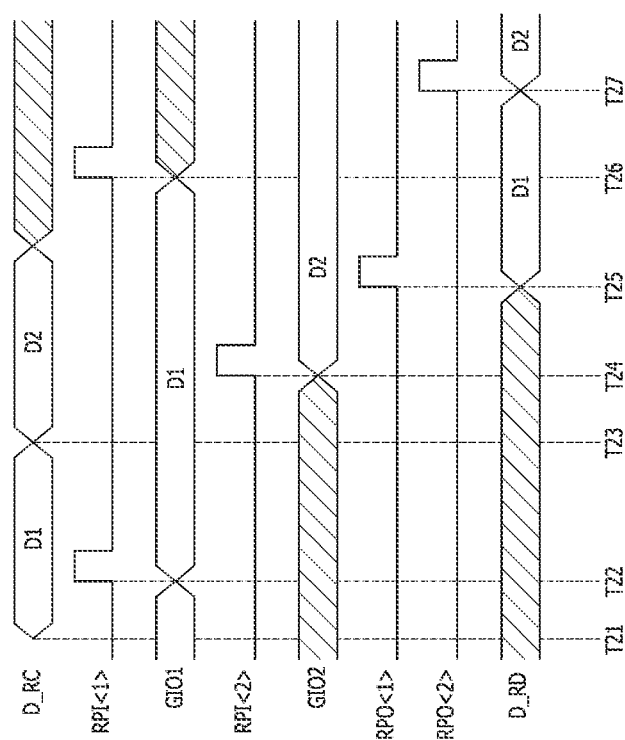

FIG. 19 is a timing diagram illustrating a read operation of the input/output control circuit 15A of FIG. 13.

As shown in FIG. 19, at time point T21, the read core data (D_RC) D1 for a first read operation may be output from the cell area (17 of FIG. 1), and at time point T23, the read core data (D_RC) D2 for a second read operation may be output from the cell area 17. In addition, as shown in FIG. 19, a first pulse of the first read input signal RPI<1> may be generated by the first read operation at time point T22, a first pulse of the second read input signal RPI<2> may be generated by the second read operation at time point T24, and a second pulse of the first read input signal RPI<1> may be generated by a third read operation at time point T26. In addition, as shown in FIG. 19, a first pulse of the first read output signal RPO<1> by the first read operation may be generated at time point T25, and a first pulse of the second read output signal RPO<2> by the second read operation may be generated at time point T27. In this situation, the data window of the read core data (D_RC) D1 for the read operation may be set to the section T21~T23, and the data window of the data loaded on the first global input/output line GIO1 may be set to a section T22~T26. Accordingly, in the continuous read operation, the data window of the data loaded on the first global input/output line GIO1 may increase by twice the data window of the write data D_RD output from the cell area 17 in the read operation. As described above, when a continuous read operation is performed, the first read input signal RPIPI<1> and the second read input signal RPIPI<2> may be generated separately, and the first read output signal RPO<1> and the second read output signal RPO<2> may be generated separately. Accordingly, in an embodiment, the data window of the data loaded on the first global input/output line GIO1 may be secured as large as twice, and thus, a sufficient margin of data may be secured during the data input/output operation.

Figure 20:
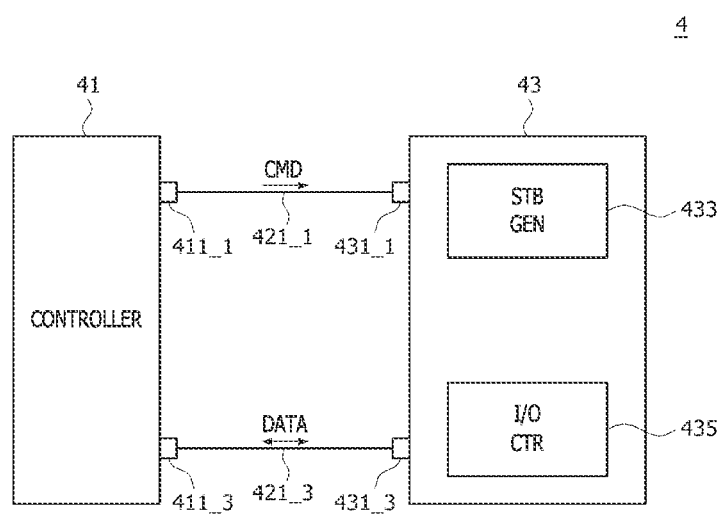
FIG. 20 is a block diagram illustrating a configuration of a semiconductor system according to an embodiment of the present disclosure.

FIG. 20 is a block diagram illustrating a configuration of a semiconductor system 4 according to an embodiment of the present disclosure. As shown in FIG. 20, the semiconductor system 4 may include a controller 41 and a semiconductor device 43.

The controller 41 may include a first control pin 411_1 and a second control pin 411_3. The semiconductor device 43 may include a first device pin 431_1 and a second device pin 431_3. The controller 41 may transmit a command CMD to the semiconductor device 43 through a first transmission line 421_1 connected between the first control pin 411_1 and the first device pin 431_1. Each of the first control pin 411_1, the first transmission line 421_1, and the first device pin 431_1 may be implemented in plurality according to the number of bits of the command CMD. The controller 41 may apply data DATA to the semiconductor device 43 through a second transmission line 421_3 connected between the second control pin 411_3 and the second device pin 431_3. The controller 41 may receive data DATA from the semiconductor device 43 through the second transmission line 421_3 connected between the second control pin 411_3 and the second device pin 431_3. Each of the second control pin 411_3, the second device pin 431_3, and the second transmission line 421_3 may be implemented in plurality according to the number of bits of the transmission data DATA.

The semiconductor device 43 may include a strobing signal generating circuit (STB GEN) 433 and an input/output control circuit (I/O CTR) 435. Because each of the strobing signal generating circuit 433 and the input/output control circuit 435 may be implemented identically to the strobing signal generating circuit 13 and the input/output control circuit 15 shown in FIG. 1, detailed descriptions of configuration and operation will be omitted.

Figure 21:
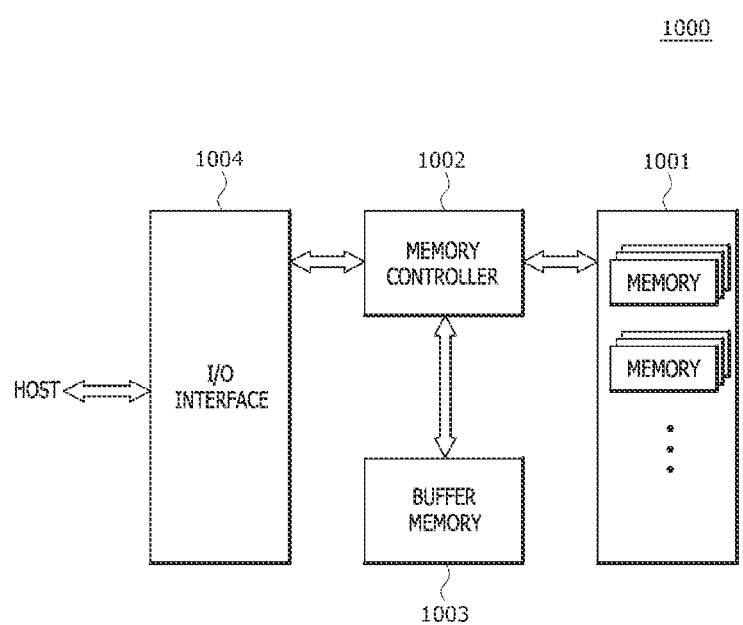
FIG. 21 is a block diagram illustrating a configuration of an electronic system according to an embodiment of the present disclosure.

The semiconductor device 1 described above with reference to FIG. 1 and the semiconductor device 43 shown in FIG. 20 may be applied to electronic systems including a memory system, a graphic system, a computing system, a mobile system, and the like. For example, FIG. 21 is a block diagram illustrating a configuration of an electronic system 1000 according to an embodiment of the present disclosure. Referring to FIG. 21, the electronic system 1000 may include a data storage unit 1001, a memory controller 1002, a buffer memory 1003, and an input/output interface 1004.

The data storage unit 1001 may store data (not shown) applied from the memory controller 1002 according to a control signal from the memory controller 1002, and may read stored data (not shown) to output the data to the memory controller 1002. Meanwhile, the data storage unit 1001 may include a non-volatile memory device capable of continuously storing data without loss even when power is cut off. The non-volatile memory device may be implemented with a flash memory (NAND flash memory) device, a phase change random access memory (PRAM) device, a resistive random access memory (RRAM) device, a spin transfer torque random access memory (STTRAM) device, and a magnetic random access memory (MRAM) device.

The memory controller 1002 may decode instructions applied from an external device (host device) through the input/output interface 1004, and control data input/output to the data storage unit 1001 and the buffer memory 1003 according to a result of decoding. In FIG. 21, the memory controller 1002 is shown as one block, but the memory controller 1002 may include a controller for controlling the data storage unit 1001 and a controller for controlling the buffer memory 1003, which is a volatile memory, which are configured independently of each other. The memory controller 1002 may include the controller 41 described in FIG. 20.

The buffer memory 1003 may store data to be processed by the memory controller 1002, that is, data input and output to the data storage unit 1001 (not shown). The buffer memory 1003 may store data (not shown) applied from the memory controller 1002 according to a control signal. The buffer memory 1003 may include the semiconductor device 1 shown in FIG. 1 and the semiconductor device 43 shown in FIG. 20. The buffer memory 1003 may read the stored data, and output the data to the memory controller 1002. The buffer memory 1003 may include a volatile memory device such as a dynamic random access memory (DRAM) device, a mobile DRAM device, and a static random access memory (SRAM) device.

The input/output interface 1004 may provide a physical connection between the memory controller 1002 and an external device (host) to allow the memory controller 1002 to receive the control signal for data input/output from the external device and to exchange data with the external device. The input/output interface 1004 may include one of a variety of interface protocols such as USB, MMC, PCI-E, SAS, SATA, PATA, SCSI, ESDI, and IDE.

The electronic system 1000 may be used as an auxiliary storage device or an external storage device of the host device. The electronic system 1000 may include a solid state disk (SSD), a universal serial bus memory (USB memory), a secure digital card (SD), a mini secure digital card (mSD), a micro secure digital card (micro SD), secure digital high capacity (SDHC), a memory stick card, a smart media card (SM), a multi-media card (MMC), an embedded multi-media card (embedded MMC; eMMC), a compact flash card (CF), and the like.

Figure 22:
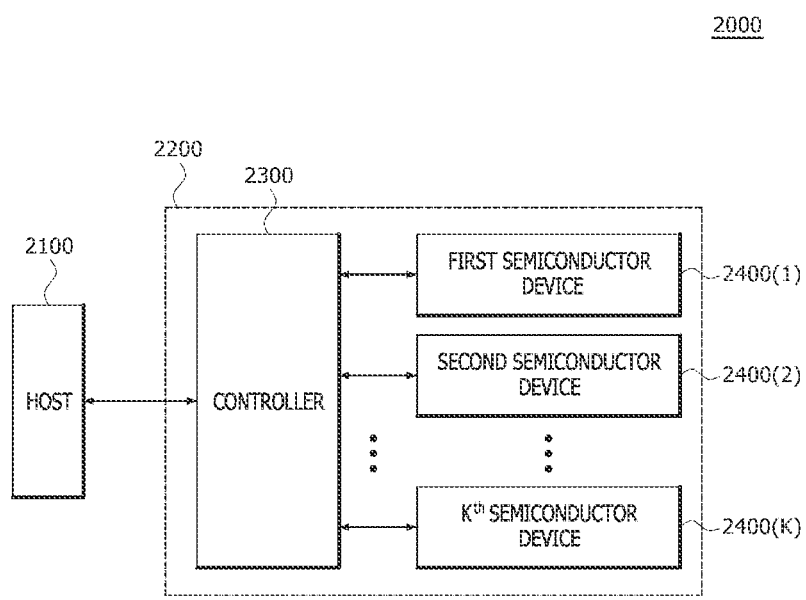
FIG. 22 is a block diagram illustrating a configuration of an electronic system according to another embodiment of the present disclosure.

FIG. 22 is a block diagram illustrating a configuration of an electronic system 2000 according to another embodiment of the present disclosure. As shown in FIG. 22, the electronic system 2000 may include a host 2100 and a semiconductor system 2200.

The host 2100 and the semiconductor system 2200 may transmit signals to each other using an interface protocol. The interface protocol used between the host 2100 and the semiconductor system 2200 may include a multi-media card (MMC), enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), and universal serial bus (USB).

The semiconductor system 2200 may include a controller 2300 and semiconductor devices 2400(1:K). The controller 2300 may apply a command CMD and transmission data DATA to each of the semiconductor devices 2400(1:K). Each of the semiconductor devices 2400(1:K) may greatly expand a data window loaded on a global I/O line during a write operation and a read operation.

The controller 2300 may include the controller 41 described with reference to FIG. 20. Each of the semiconductor devices 2400(1:K) may include the semiconductor device 1 described with reference to FIG. 1 and the semiconductor device 43 described with reference to FIG. 20. Each of the semiconductor devices 2400(1:K) may be implemented with one of a dynamic random access memory (DRAM) device, a phase change random access memory (PRAM) device, a resistive random access memory (RRAM) device, a magnetic random access memory (MRAM) device, and a ferroelectric random access memory (FRAM) device.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope is not limited to the above descriptions but defined by the accompanying claims, and all of distinctive features in the equivalent scope should be construed as being included.

What is claimed is:

1. A semiconductor device comprising:
a strobing signal generating circuit configured to sequentially generate write input signals, based on a write strobing signal and to sequentially generate write output signals, based on a delayed write strobing signal when a write operation is performed; and
an input and output (input/output) control circuit configured to receive and latch write data input from a data input/output circuit, based on the write input signals, and to store the latched write data in a cell area as write core data, based on the write output signals.

2. The semiconductor device of claim 1, wherein the strobing signal generating circuit is configured to receive a write command generated by decoding a command when the write operation is performed.

3. The semiconductor device of claim 1, wherein the strobing signal generating circuit is configured to:
generate the write strobing signal, based on the write command when the write operation is performed; and
delay the write strobing signal to generate the delayed write strobing signal.

4. The semiconductor device of claim 1,
wherein the write input signals include a first write input signal and a second write input signal, and
wherein the strobing signal generating circuit is configured to:
generate a first pulse of the first write input signal when a first pulse of the write strobing signal is generated;
generate a first pulse of the second write input signal when a second pulse of the write strobing signal is generated; and
generate a second pulse of the first write input signal when a third pulse of the write strobing signal is generated.

5. The semiconductor device of claim 1,
wherein the write output signals include a first write output signal and a second write output signal, and
wherein the strobing signal generating circuit is configured to:
generate a first pulse of the first write output signal when a first pulse of the delayed write strobing signal is generated;
generate a first pulse of the second write output signal when a second pulse of the delayed write strobing signal is generated; and
generate a second pulse of the first write output signal when a third pulse of the delayed write strobing signal is generated.

6. The semiconductor device of claim 1, wherein the strobing signal generating circuit includes:
a write strobing signal generating circuit configured to generate the write strobing signal, based on a write command;
a write input signal generating circuit configured to sequentially generate the write input signals, based on the write strobing signal;
a write strobing signal delay circuit configured to delay the write strobing signal to generate the delayed write strobing signal; and
a write output signal generating circuit configured to sequentially generate the write output signals, based on the delayed write strobing signal.

7. The semiconductor device of claim 1,
wherein the write input signals include a first write input signal and a second write input signal, and
wherein the strobing signal generating circuit includes:
a first write input signal generating circuit configured to generate the first write input signal whenever a pulse of the write strobing signal is received while a first selection write input signal is activated; and
a second write input signal generating circuit configured to generate the second write input signal whenever a pulse of the write strobing signal is received while a second selection write input signal is activated.

8. The semiconductor device of claim 7,
wherein the first write input signal generating circuit is configured to initialize the first selection write input signal, based on a reset signal in an initialization operation, and
wherein the second write input signal generating circuit is configured to initialize the second selection write input signal, based on the reset signal in the initialization operation.

9. The semiconductor device of claim 7,
wherein the first write input signal generating circuit is configured to set a logic level of the first selection write input signal according to the second selection write input signal after the pulse of the write strobing signal is received, and
wherein the second write input signal generating circuit is configured to set a logic level of the second selection write input signal according to the first selection write input signal after the pulse of the write strobing signal is received.

10. The semiconductor device of claim 1,
wherein the write output signals include a first write output signal and a second write output signal, and
wherein the strobing signal generating circuit includes:
a first write output signal generating circuit configured to generate the first write output signal whenever a pulse of the delayed write strobing signal is received while a first selection write output signal is activated; and
a second write output signal generating circuit configured to generate the second write output signal whenever a pulse of the delayed write strobing signal is received while a second selection write output signal is activated.

11. The semiconductor device of claim 10,
wherein the first write output signal generating circuit is configured to initialize the first selection write output signal, based on a reset signal in an initialization operation, and
wherein the second write output signal generating circuit is configured to initialize the second selection write output signal, based on the reset signal in the initialization operation.

12. The semiconductor device of claim 1,
wherein the write input signals include a first write input signal and a second write input signal, and the write output signals include a first write output signal and a second write output signal, and
wherein the input/output control circuit includes:
a first transceiver configured to receive the write data to output the write data to a first global input/output line, based on the first write input signal;

a first latch circuit configured to latch data loaded on the first global input/output line; and a second transceiver configured to receive the data latched in the first latch circuit through the first global input/output line to output the latched signal as the write core data, based on the first write output signal.

13. The semiconductor device of claim 12, wherein the input/output control circuit further includes:

a third transceiver configured to receive the write data to output the write data to a second first global input/output line, based on the second write input signal;

a second latch circuit configured to latch data loaded on the second global input/output line; and a fourth transceiver configured to receive the data latched in the second latch circuit through the second global input/output line to output the latched signal as the write core data, based on the second write output signal.

14. A semiconductor device comprising:

a strobing signal generating circuit configured to sequentially generate read input signals, based on a read strobing signal and to sequentially generate read output signals, based on a delayed read strobing signal when a read operation is performed; and an input and output (input/output) control circuit configured to receive and latch read core data output from a cell area, based on the read input signals, and to output the latched read core data to a data input/output circuit as read data, based on the read output signals.

15. The semiconductor device of claim 14, wherein the strobing signal generating circuit is configured to receive a read command generated by decoding a command when the read operation is performed.

16. The semiconductor device of claim 14, wherein the strobing signal generating circuit is configured to:

generate the read strobing signal, based on a read command when the read operation is performed; and delay the read strobing signal to generate the delayed read strobing signal.

17. The semiconductor device of claim 14, wherein the read input signals include a first read input signal and a second read input signal, and wherein the strobing signal generating circuit is configured to:

generate a first pulse of the first read input signal when a first pulse of the read strobing signal is generated, generate a first pulse of the second read input signal when a second pulse of the read strobing signal is generated, and generate a second pulse of the first read input signal when a third pulse of the read strobing signal is generated.

18. The semiconductor device of claim 14, wherein the read output signals include a first read output signal and a second read output signal, and wherein the strobing signal generating circuit is configured to:

generate a first pulse of the first read output signal when a first pulse of the delayed read strobing signal is generated, generate a first pulse of the second read output signal when a second pulse of the delayed read strobing signal is generated, and generate a second pulse of the first read output signal when a third pulse of the delayed read strobing signal is generated.

19. The semiconductor device of claim 14, wherein the strobing signal generating circuit includes:

a read strobing signal generating circuit configured to generate the read strobing signal, based on a read command;

a read input signal generating circuit configured to sequentially generate the read input signals, based on the read strobing signal;

a read strobing signal delay circuit configured to delay the read strobing signal to generate the delayed read strobing signal; and a read output signal generating circuit configured to sequentially generate the read output signals, based on the delayed read strobing signal.

20. The semiconductor device of claim 14, wherein the read input signals include a first read input signal and a second read input signal, and wherein the strobing signal generating circuit includes:

a first read input signal generating circuit configured to generate the first read input signal whenever a pulse of the read strobing signal is received while a first selection read input signal is activated; and a second read input signal generating circuit configured to generate the second read input signal whenever a pulse of the read strobing signal is received while a second selection read input signal is activated.

21. The semiconductor device of claim 20, wherein the first read input signal generating circuit is configured to initialize the first selection read input signal, based on a reset signal in an initialization operation, and wherein the second read input signal generating circuit is configured to initialize the second selection read input signal, based on the reset signal in the initialization operation.

22. The semiconductor device of claim 20, wherein the first read input signal generating circuit is configured to set a logic level of the first selection read input signal according to the second selection read input signal after the pulse of the read strobing signal is received, and wherein the second read input signal generating circuit is configured to set a logic level of the second selection read input signal according to the first selection read input signal after the pulse of the read strobing signal is received.

23. The semiconductor device of claim 14, wherein the read output signals include a first read output signal and a second read output signal, and wherein the strobing signal generating circuit includes:

a first read output signal generating circuit configured to generate the first read output signal whenever a pulse of the delayed read strobing signal is received while a first selection read output signal is activated; and a second read output signal generating circuit configured to generate the second read output signal whenever a pulse of the delayed read strobing signal is received while a second selection read output signal is activated.

24. The semiconductor device of claim 23, wherein the first read output signal generating circuit is configured to initialize the first selection read output signal, based on a reset signal in an initialization operation, and wherein the second read output signal generating circuit is configured to initialize the second selection read output signal, based on the reset signal in the initialization operation.

25. The semiconductor device of claim 14,
wherein the read input signals include a first read input signal and a second read input signal, and the read output signals include a first read output signal and a second read output signal, and
wherein the input/output control circuit includes:
a first transceiver configured to receive the read data to output the read data to a first global input/output line, based on the first read input signal;
a first latch circuit configured to latch data loaded on the first global input/output line; and
a second transceiver configured to receive the data latched in the first latch circuit through the first global input/output line to output the latched signal as the read core data, based on the first read output signal.

26. The semiconductor device of claim 25, wherein the input/output control circuit further includes:
a third transceiver configured to receive the read data to output the read data to a second first global input/output line, based on the second read input signal;
a second latch circuit configured to latch data loaded on the second global input/output line; and
a fourth transceiver configured to receive the data latched in the second latch circuit through the second global input/output line to output the latched signal as the read core data, based on the second read output signal.

27. A semiconductor device comprising:
a strobing signal generating circuit configured to sequentially generate write input signals, based on a write strobing signal and sequentially generate write output signals, based on a delayed write strobing signal when a write operation is performed, and to sequentially generate read input signals, based on a read strobing signal and sequentially generate read output signals, based on a delayed read strobing signal when a read operation is performed; and
an input and output (input/output) control circuit configured to receive and latch write data input from a data input/output circuit, based on the write input signals, to store the latched write data in a cell area as write core data, based on the write output signals, to receive and latch read core data output from the cell area, based on the read input signals, and to output the latched read core data to the data input/output circuit as read data, based on the read output signals.

28. The semiconductor device of claim 27,
wherein the write input signals include a first write input signal and a second write input signal, the write output signals include a first write output signal and a second write output signal, the read input signals include a first read input signal and a second read input signal, and the read output signals include a first read output signal and a second read output signal, and
wherein the input/output control circuit includes a first transceiver configured to receive the write data to output the write data to a first global input/output line, based on the first write input signal, and to receive the data latched in the first latch circuit through the first global input/output line to output the data as the read data, based on the first read output signal.

29. The semiconductor device of claim 28, wherein the input/output control circuit further includes a first latch circuit configured to latch the data loaded on the first global input/output line.

30. The semiconductor device of claim 29, wherein the input/output control circuit further includes a second transceiver configured to receive the data latched in the first latch circuit to output the data as the write core data, based on the first write output signal, and to receive the read core data to output the read core data to the first global input/output line, based on the first read input signal.

31. The semiconductor device of claim 30, wherein the input/output control circuit further includes a third transceiver configured to receive the write data to output the write data to the first global input/output line, based on the second write input signal, and to receive data latched in the second latch circuit through the second global input/output line to output the data as the read data, based on the second read output signal.

32. The semiconductor device of claim 31, wherein the input/output control circuit further includes a second latch circuit configured to latch the data loaded on the second global input/output line.

33. The semiconductor device of claim 32, wherein the input/output control circuit further includes a fourth transceiver configured to receive the data latched in the second latch circuit to output as the write core data, based on the second write output signal, and to receive the read core data to output the read core data to the second global input/output line, based on the second read input signal.

* * * * *